(12) United States Patent
Wang et al.

(10) Patent No.: US 11,605,574 B2
(45) Date of Patent: Mar. 14, 2023

(54) METHOD OF FORMING A THERMAL SHIELD IN A MONOLITHIC 3-D INTEGRATED CIRCUIT

(71) Applicant: Samsung Electronics Co., Ltd., Suwon-si (KR)

(72) Inventors: Wei-E Wang, Austin, TX (US); Mark S. Rodder, Dallas, TX (US); Vassilios Gerousis, Georgetown, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 192 days.

(21) Appl. No.: 17/189,777

(22) Filed: Mar. 2, 2021

(65) Prior Publication Data

US 2021/0183729 A1    Jun. 17, 2021

Related U.S. Application Data

(62) Division of application No. 16/374,524, filed on Apr. 3, 2019, now Pat. No. 10,971,420.

(60) Provisional application No. 62/784,317, filed on Dec. 21, 2018.

(51) Int. Cl.
| | | |
|---|---|---|
| H01L 23/367 | (2006.01) | |
| H01L 23/373 | (2006.01) | |
| H01L 27/06 | (2006.01) | |
| H01L 25/065 | (2006.01) | |
| H01L 23/522 | (2006.01) | |

(52) U.S. Cl.
CPC ...... *H01L 23/3675* (2013.01); *H01L 23/3735* (2013.01); *H01L 23/5226* (2013.01); *H01L 25/0657* (2013.01); *H01L 27/0694* (2013.01)

(58) Field of Classification Search
CPC ............ H01L 23/3675; H01L 23/3735; H01L 23/5226; H01L 25/0657; H01L 27/0694; H01L 27/088; H01L 23/3731; H01L 27/0688; H01L 23/36; H01L 23/3733; H01L 25/50; H01L 23/373; H01L 23/367; H01L 23/528
USPC ...................................................... 257/713
See application file for complete search history.

(56) References Cited

U.S. PATENT DOCUMENTS

| | | |
|---|---|---|
| 8,080,866 B2 | 12/2011 | Werner et al. |
| 8,395,191 B2 | 3/2013 | Or-Bach et al. |
| 8,557,632 B1 | 10/2013 | Or-Bach et al. |
| 8,574,929 B1 | 11/2013 | Or-Bach et al. |
| 8,686,428 B1 | 4/2014 | Sekar et al. |

(Continued)

OTHER PUBLICATIONS

Batude, P. et al., "3DVLSI with CoolCube process: An alternative path to scaling," Symposium on VLSI Technology Digest of Technical Papers, 2015, 2 pages.

(Continued)

*Primary Examiner* — Tong-Ho Kim
(74) *Attorney, Agent, or Firm* — Lewis Roca Rothgerber Christie LLP

(57) ABSTRACT

A monolithic three-dimensional integrated circuit including a first device, a second device on the first device, and a thermal shield stack between the first device and the second device. The thermal shield stack includes a thermal retarder portion having a low thermal conductivity in a vertical direction, and a thermal spreader portion having a high thermal conductivity in a horizontal direction. The thermal shield stack of the monolithic three-dimensional integrated circuit includes only dielectric materials.

19 Claims, 12 Drawing Sheets

(56) References Cited

U.S. PATENT DOCUMENTS

| | | | |
|---|---|---|---|
| 9,023,688 B1 | 5/2015 | Or-Bach et al. | |
| 9,460,991 B1 | 10/2016 | Or-Bach et al. | |
| 9,536,840 B2 | 1/2017 | Du | |
| 10,014,292 B2 | 7/2018 | Or-Bach et al. | |
| 10,043,781 B2 | 8/2018 | Sekar et al. | |
| 2006/0040471 A1 | 2/2006 | Ramanathan et al. | |
| 2010/0052134 A1* | 3/2010 | Werner | H01L 25/50 257/E23.141 |
| 2014/0225235 A1* | 8/2014 | Du | H01L 27/0688 257/659 |
| 2015/0021771 A1* | 1/2015 | Lin | H01L 23/481 438/459 |
| 2017/0018479 A1 | 1/2017 | Sagong et al. | |
| 2017/0213821 A1 | 7/2017 | Or-Bach et al. | |
| 2018/0063996 A1 | 3/2018 | Vitale | |
| 2018/0211899 A1 | 7/2018 | Morianz et al. | |

OTHER PUBLICATIONS

Bruel, M. et al., "Smart Cut: A Promising New SOI Material Technology," Proceedings 1995 IEEE International SOI Conference, Oct. 1995, 2 pages.

Colwell, Robert, "The Chip Design Game at the End of Moore's Law," DARPA, 2013, 16 pages.

Daly, Brian C. et al., "Optical pump and probe measurement of the thermal conductivity of low-k dielectric thin films," Journal of Applied Physics, vol. 92, No. 10, 2002, 6 pages.

DeBenedictis, Erik P., "Its Time to Redefine Moore's Law Again," Rebooting Computing, IEEE Computer Society, 2017, 4 pages.

Delan, A. et al., "Thermal conductivity of ultra low-k dielectrics," Microelectronic Engineering, vol. 70, 2003, 5 pages.

Flamm, Kenneth, "Has Moore's Law Been Repealed? An Economist's Perspective," Computing in Science & Engineering, IEEE CS and the AIP, 2017, 12 pages.

Gluschenkov, O. et al., "Laser Annealing in CMOS Manufacturing," ECS Transactions, vol. 85, 2018, 13 pages.

Kalra, Pankaj et al., "Impact of Flash Annealing on Performance and Reliability of High-k/Metal-Gate MOSFETs for sub-45 nm CMOS," 2007 IEEE International Electron Devices Meeting, IEEE, 2007, 4 pages.

Koh, Donghyi et al., "Investigation of atomic layer deposited beryllium oxide material properties for high-k dielectric applications," Journal of Vacuum Science & Technology B, vol. 32, 2014, 9 pages.

Lee, Seung Min et al., "Advanced Silicon-on-Insulator: Crystalline Silicon on Atomic Layer Deposited Beryllium Oxide," Scientific Reports, 2017, 7 pages.

Min, K.S. et al., "Atomic layer etching of BeO using BCl[sub 3]/Ar for the interface passivation layer of III-V MOS devices," Microelectronic Engineering, vol. 114, 2014, 5 pages.

Oswald, Jens et al., "2.5D packaging solution—from concept to platform qualification," 17th Electronics Packaging Technology Conference, 2015, 7 pages.

Sprenger, Jaclyn K. et al., "Electron-Enhanced Atomic Layer Deposition of Boron Nitride Thin Films at Room Temperature and 100 C," The Journal of Physical Chemistry C, vol. 122, 2018, 10 pages.

Tanaka, Tetsu, "3D-IC Technology and Reliability Challenges," Ext. Abs. the 17th International Workshop on Junction Technology, 2017, 3 pages.

Watari, Koji, "High Thermal Conductivity Non-Oxide Ceramics," Journal of the Ceramic Society of Japan, vol. 109, 2001, 10 pages.

Yang, Ruipeng et al., "Advanced in situ pre-Ni silicide (Siconi) cleaning at 65 nm to resolve defects in NiSi[sub x] modules," Journal of Vacuum Science & Technology B, vol. 28, 2010, 7 pages.

Cronquist, Brian et al., "Monolithic 3D IC: The Time is Now," 2014 Intl. Workshop on Data-Abundant System Technology, 2014, 79 pages, URL: https://n3xt.stanford.edu/system/files/b_cronquist_-_monolithic_3d.pdf.

Internet: "Embedded Multi-Die Interconnect Bridge: A breakthrough in advanced packaging technology," Intel Custom Foundry EMIB, URL: https://www.intel.com/content/www/us/en/foundry/emib.html.

* cited by examiner

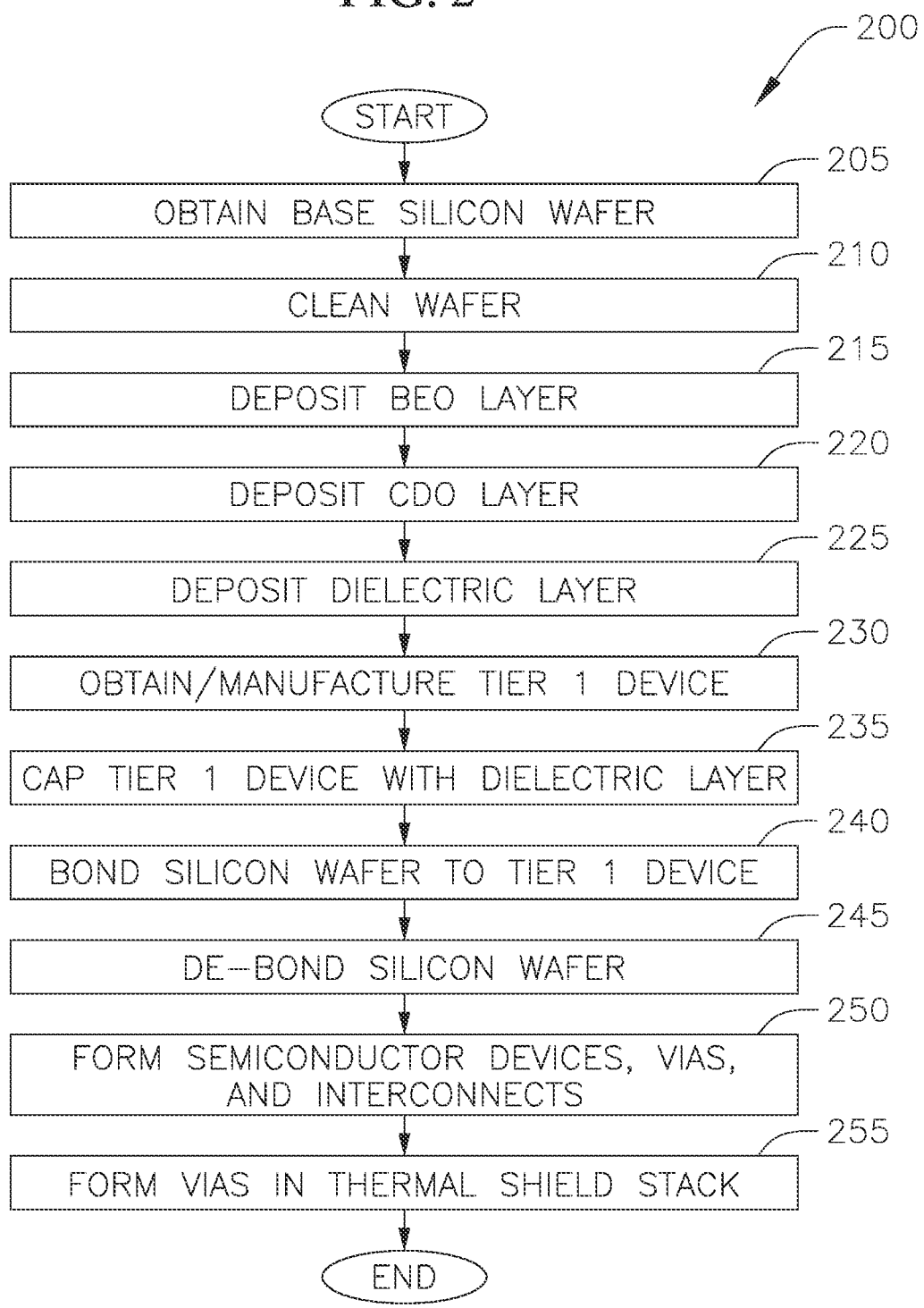

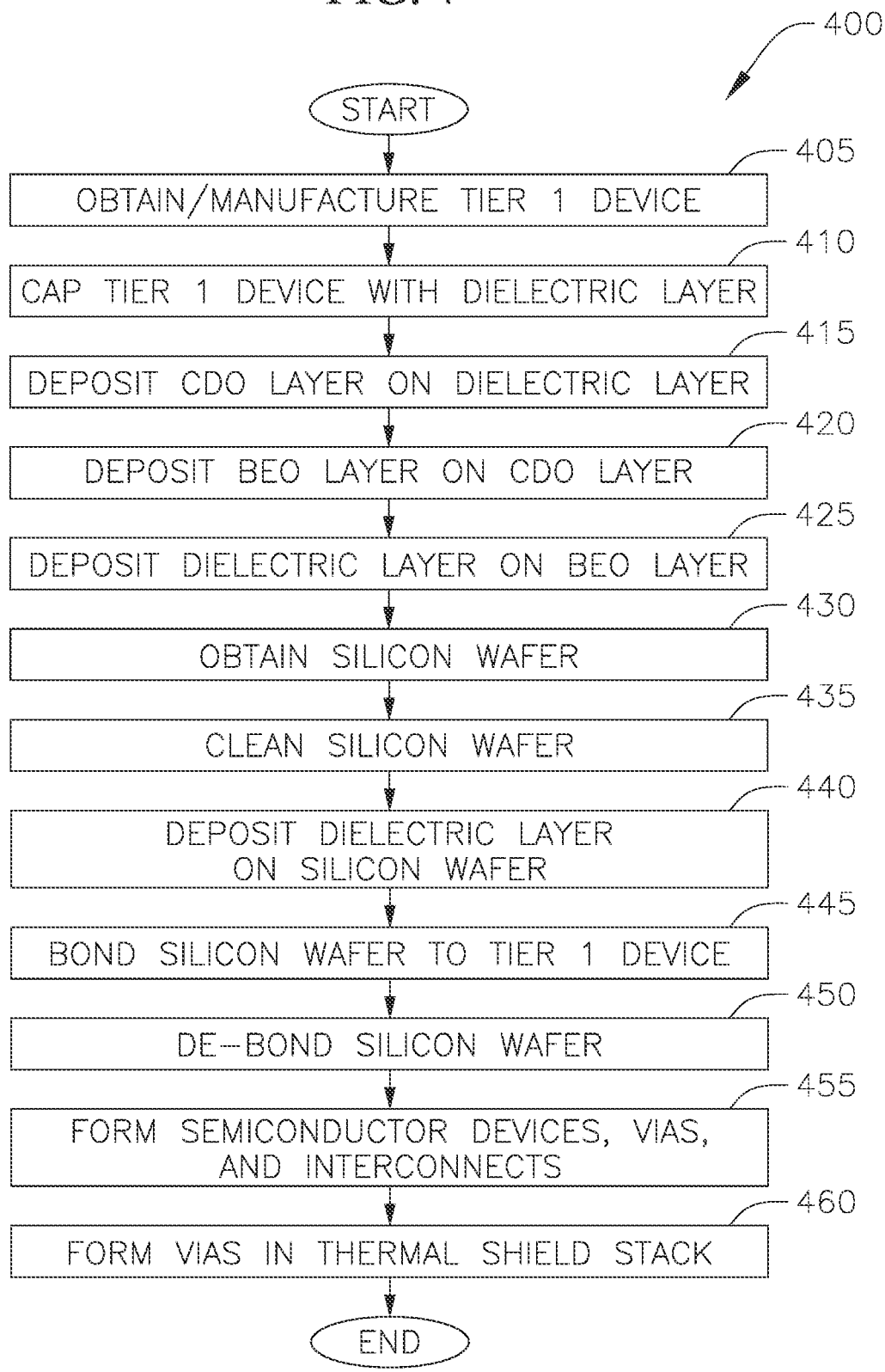

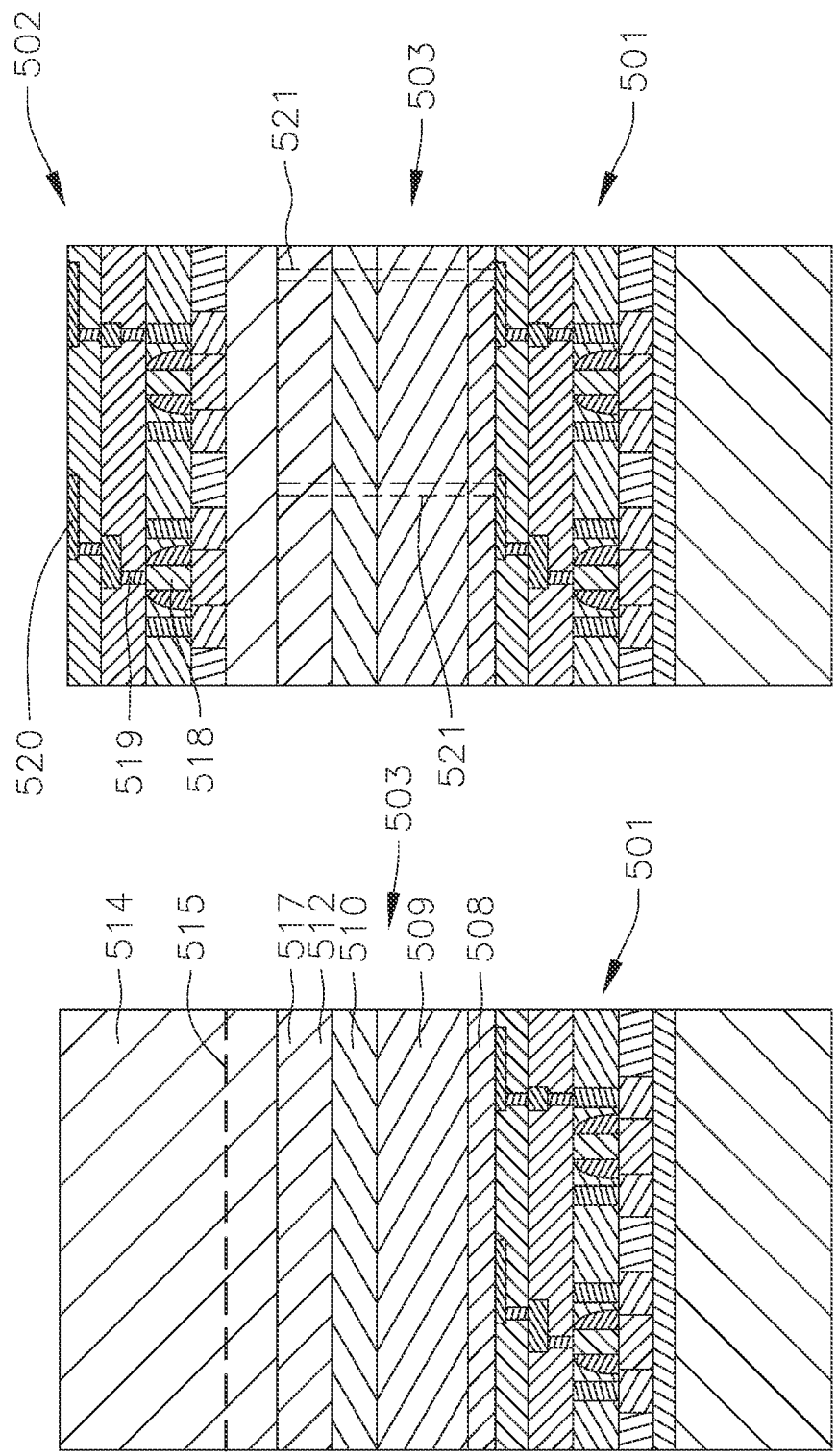

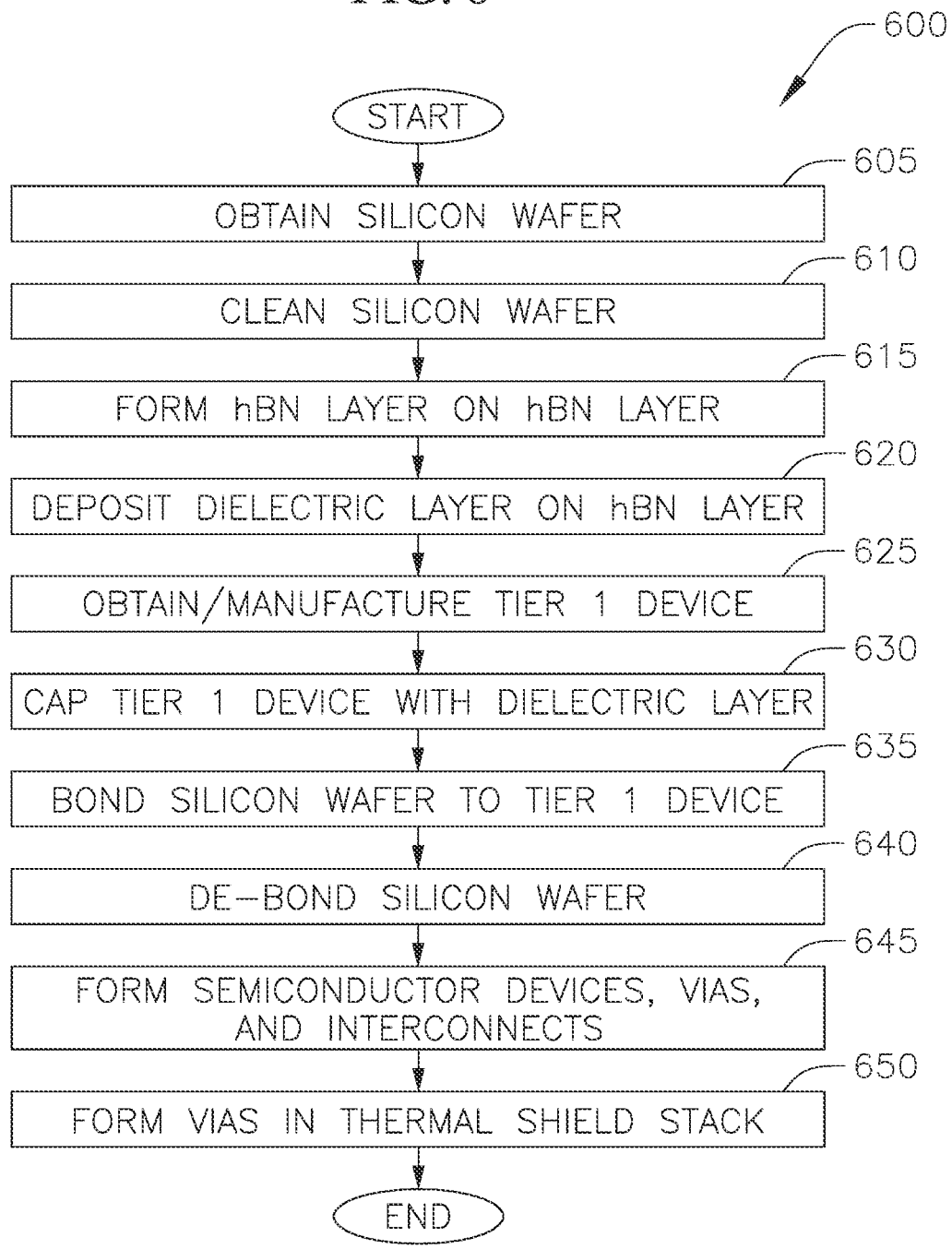

METHOD OF FORMING A THERMAL SHIELD IN A MONOLITHIC 3-D INTEGRATED CIRCUIT

CROSS-REFERENCE TO RELATED APPLICATION(S)

This application is a divisional of U.S. patent application Ser. No. 16/374,524, filed Apr. 3, 2019, which claims priority to and the benefit of U.S. Provisional Application No. 62/784,317, filed Dec. 21, 2018, the entire contents of both of which are incorporated herein by reference.

BACKGROUND

1. Field

The present disclosure relates generally to thermal shield stacks for monolithic three-dimensional integrated circuits and methods of manufacturing the same.

2. Description of Related Art

To maintain the Moore's law like growth in the semiconductor industry, it has been proposed to stack dies (e.g., a Tier 1 die and a Tier 2 die) into a 2.5D package or a 3D package. In a 2.5D package, pre-fabricated dies are placed on a silicon interposer and connected with various thick copper redistribution layers (RDL). Other 2.5D packages, such as an embedded multi-die interconnect bridge (EMIB), include a small piece of silicon embedded only under the edges of two interconnecting dies, which allows for dies of most sizes to be attached in multiple directions without utilizing silicon interposers.

Related art 3D packages include TSV-3D, 3D Wafer-Level Chip-Scale Packaging (WLCSP), and Monolithic 3D (M3D). For example, in a related art TSV-3D, each Tier is a finished die manufactured separately, and the corresponding 3D connectivity is achieved with front bumps/pads, backside bumps/pads and TSV (drilled hole) with copper metal filled. In related art TSV-free M3D devices, a first tier including an unfinished wafer containing semiconductor devices and interconnect layers, is bonded to a second tier on top of the first tier through vias as interconnects and layer-by-layer manufacturing for the second tier is carried out in the presence of the first tier beneath the second tier.

In general, M3D devices exhibit superior performance over 2.5D devices due to their almost 3-4 orders of magnitude reduction in the area overhead (at the same via or TSV density). However, the manufacturing process requirements for M3D devices are much more challenging than those of 2.5D device, including thermal management and Cu contamination issues. For instance, a high-temperature anneal (e.g., at a temperature greater than 1,000° C.) may be performed during manufacturing of the M3D device to improve dopant activation efficiency and reliability of the semiconductor devices of the Tier2 device. However, this high-temperature anneal may adversely affect the previously fabricated semiconductor devices of the Tier1 device, such as by causing excessive dopant diffusion in the semiconductor devices of the Tier1 device (e.g., if the temperature exceeds approximately 700° C.) and/or by damaging or otherwise negatively impacting the copper metal interconnection lines (e.g., if the temperature exceeds approximately 400° C.).

Some related art M3D devices include a thermal shield stack between the Tier1 device and the Tier2 device to protect the Tier1 device from excessive heat during the high-temperature annealing of the Tier2 device. For instance, some related art thermal shield stacks include a first inter-shield layer, a bottom shield layer formed of copper on the first inter-shield layer, a second inter-shield layer on the bottom shield layer, and a top shield layer formed of copper on the second inter-shield layer. The copper shield layers are configured to reflect and absorb light and exhibit high thermal conductivity to quickly and effectively spread the heat generated from the absorbed light, whereas the inter-shield layers exhibit poor thermal conductivity and are therefore configured to retard the heat generated during the high-temperature anneal process from dissipating downward toward the Tier1 device. However, the thermal shield stack must be etched in a subsequent process to form the vias interconnecting the Tier1 device to the Tier2 device, and the copper shield layers in this related art thermal shield stack are extremely difficult to etch due to copper's lack of natural volatile compounds. Furthermore, this related art thermal shield stack is not electrically insulating due to the copper shield layers.

Other related art thermal shield stacks may include materials that are electrically insulating and exhibit good thermal conductivity, such as diamond (which has a thermal conductivity k-value of greater than 2,000 W/m·K) or hexagonal boron nitride (hBN). However, no manufacturable atomic layer deposition (ALD) or chemical vapor deposition (CVD) processes are available for forming a sufficiently thin (e.g., 20 nm or less) and uniform diamond layer, as required by the thermal shield stacks of interest.

Epitaxially grown hBN has a hexagonal lattice structure that exhibits anisotropic thermal conductivity, including very high in-plane thermal conductivity (e.g., a k-value of approximately 400 W/m·K) and poor out-of-plane thermal conductivity (e.g., a k-value of approximately 5 W/m·K). The high in-plane thermal conductivity is configured to aid in the dissipation of heat sideways out of the M3D device, and the poor out-of-plane thermal conductivity is configured to retard heat from dissipating downward toward the Tier1 device. However, forming the hBN layer in an epitaxial manner to yield the desired hexagonal lattice structure, and the resultant anisotropic thermal conductivity characteristic, is challenging. The current state-of-the-art approach utilizes an advanced electron-enhanced atomic layer deposition (EE-ALD) process, but the EE-ALD process requires a pristine, clean silicon surface on which to epitaxially grow the hBN layer. However, in the traditional M3D manufacturing process, the surface of silicon wafer of the Tier1 device is covered by a designed dielectric layer, such as $SiO_2$, $Si_3N_4$ or SiCN, to protect the semiconductor devices, which prevents the hBN layer from being grown in an epitaxial manner. Accordingly, the crystalline structure of the hBN layer grown in this manner is likely to be random and therefore the thermal conductivity of the hBN layer will be isotropic. Thus, the advantage of hBN is lost in these related art thermal shield stacks.

SUMMARY

The present disclosure is directed to various embodiments of a monolithic three-dimensional integrated circuit. In one embodiment, the monolithic three-dimensional integrated circuit includes a first device, a second device on the first device, and a thermal shield stack between the first device and the second device. The thermal shield stack includes a thermal retarder portion having a low thermal conductivity in a vertical direction, and a thermal spreader portion having a high thermal conductivity in a horizontal direction. The thermal shield stack of the monolithic three-dimensional integrated circuit includes only dielectric materials.

The thermal spreader portion may include BeO, SiC, SiCO, AlN, in-plane hBN, α-Si$_3$N$_4$, and β-Si$_3$N$_4$, or combinations thereof.

The thermal retarder portion may include CDO, out-of-plane hBN, Aerogel, LKD-5109, Orion 2.3, Philk, porous SILK, CF-polymer, porous SiCO, or combinations thereof.

The thermal retarder portion and the thermal spreader portion may include a bi-layer stack including BeO/CDO, AlN/Aerogel, SiC/CDO, AlN/CDO, BeO/Aerogel, SiC/Aerogel, or AlN/Aerogel.

The thermal shield stack may include a carbon doped oxide layer and a Beryllium oxide layer on a first side of the carbon doped oxide layer. The Beryllium oxide layer is between the carbon doped oxide layer and the second device.

The Beryllium oxide layer may have a thickness in a range from approximately 5 nm to approximately 30 nm.

The carbon doped oxide layer may have a thickness in a range from approximately 30 nm to approximately 50 nm.

The thermal shield stack may also include a dielectric layer on a second side of the carbon doped oxide layer opposite the first side.

The dielectric layer may include silicon dioxide (SiO$_2$), silicon carbon nitride (SiCN), or silicon nitride (Si$_3$N$_4$).

The monolithic three-dimensional integrated may also include a second dielectric layer that is on the Beryllium oxide layer.

The second dielectric layer may include silicon dioxide (SiO$_2$), silicon carbon nitride (SiCN), or silicon nitride (Si$_3$N$_4$).

The thermal shield stack may include a dielectric layer and a hexagonal boron nitride layer on the dielectric layer. The hexagonal boron nitride layer is between the dielectric layer and the second device, and the hexagonal boron nitride layer includes a hexagonal lattice structure configured to exhibit anisotropic thermal conductivity.

The hexagonal boron nitride layer may have a thickness in a range from approximately 5 nm to approximately 100 nm.

The hexagonal boron nitride layer may have a thickness in a range from approximately 5 nm to approximately 30 nm.

The present disclosure is also directed to various methods of manufacturing a monolithic three-dimensional integrated circuit including a first device, a second device on the first device, and a thermal shield stack between the first device and the second device. In one embodiment, the method includes cleaning a surface of a bare silicon wafer to remove native oxides, epitaxially growing a hexagonal boron nitride layer on the surface of the bare silicon wafer, forming a first dielectric layer on the hexagonal boron nitride layer, where the first dielectric layer and the hexagonal boron nitride layer define the thermal shield stack, forming a second dielectric layer on the first device, bonding the first dielectric layer to the second dielectric layer, forming semiconductor device, vias, and metal interconnects on the bare silicon wafer to form the second device, and forming vias in the thermal shield stack connecting the first device to the second device.

Epitaxially growing the hexagonal boron nitride layer may include an electron-enhanced atomic layer deposition process.

In another embodiment of the present disclosure, the method includes forming a Beryllium oxide layer, forming a carbon doped oxide layer, where the Beryllium oxide layer and the carbon doped oxide layer define the thermal shield stack, forming semiconductor device, vias, and metal interconnects on a bare silicon wafer to form the second device, and forming vias in the thermal shield stack connecting the first device to the second device.

Forming the Beryllium oxide layer may include depositing the Beryllium oxide layer on the bare silicon wafer, and forming the carbon doped oxide layer may include depositing the carbon doped oxide layer on the Beryllium oxide layer.

Forming the carbon doped oxide layer may include depositing the carbon doped oxide layer on the first device, and forming the Beryllium oxide layer may include depositing the Beryllium oxide layer on the carbon doped oxide layer.

This summary is provided to introduce a selection of concepts that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

The features and advantages of embodiments of the present disclosure will be better understood by reference to the following detailed description when considered in conjunction with the accompanying figures. In the figures, like reference numerals are used throughout the figures to reference like features and components. The figures are not necessarily drawn to scale.

FIG. 2 is a flowchart illustrating tasks of a method of manufacturing a thermal shield stack for a monolithic three-dimensional integrated circuit according to one embodiment of the present disclosure;

FIG. 4 is a flowchart illustrating tasks of a method of manufacturing a thermal shield stack for a monolithic three-dimensional integrated circuit according to another embodiment of the present disclosure;

FIGS. 5A-5F are schematic views illustrating the tasks performed according to the method in FIG. 4;

FIG. 6 is a flowchart illustrating tasks of a method of manufacturing a thermal shield stack for a monolithic three-dimensional integrated circuit according to another embodiment of the present disclosure.

DETAILED DESCRIPTION

Figure 1:
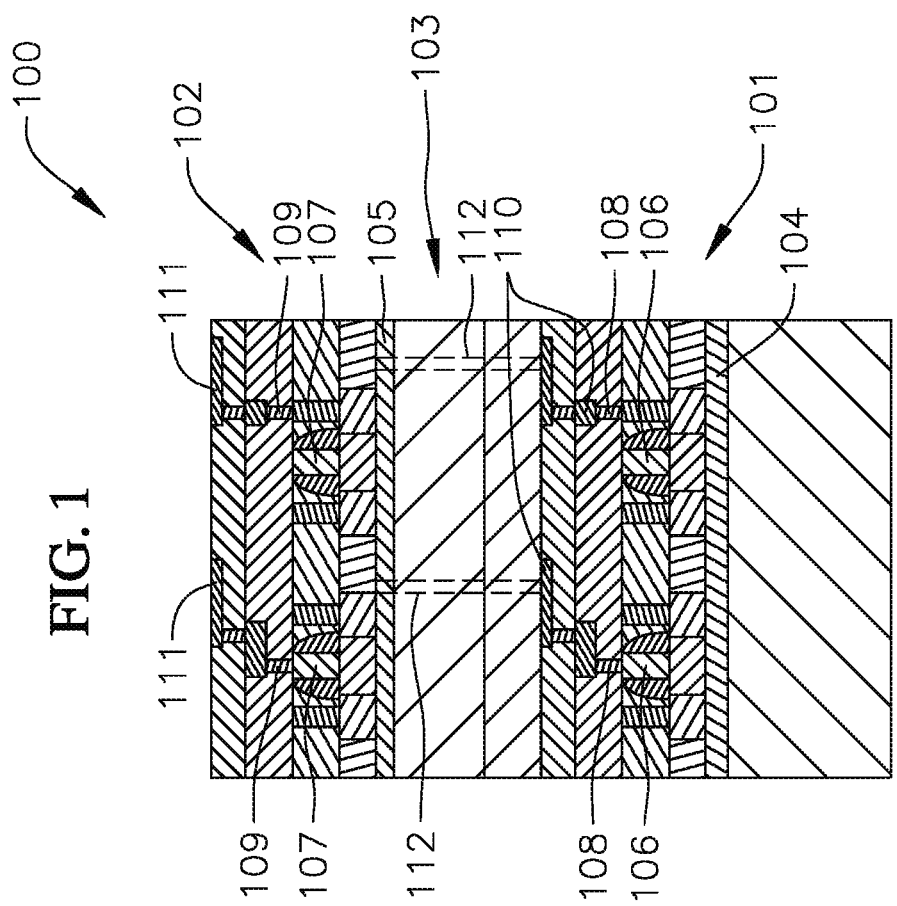
FIG. 1 is a schematic view of a monolithic three-dimensional integrated circuit including a thermal shield stack between a Tier1 device and a Tier2 device according to one embodiment of the present disclosure.

The present disclosure is directed to various methods of manufacturing a thermal shield stack for a monolithic three-dimensional integrated circuit, and various embodiments of a monolithic three-dimensional integrated circuit including a thermal shield stack. The monolithic three-dimensional integrated circuit includes a Tier1 device, a Tier2 device stacked on the Tier1 device, and a thermal shield stack between the Tier1 and Tier2 devices. The thermal shield stack according to various embodiments of the present disclosure exhibits high lateral thermal conductivity and poor out-of-plane thermal conductivity such that the thermal shield stack is configured to both dissipate heat laterally away from the Tier1 device and retard against the downward dissipation of heat toward the Tier1 device (e.g., the thermal shield stack according to various embodiments of the present disclosure exhibits anisotropic thermal conductive characteristics). In this manner, the thermal shield stack of the present disclosure is configured to protect the Tier1 device against excessive heat (e.g., a temperature exceeding 400° C.), which might otherwise cause excessive dopant diffusion in the semiconductor devices of the Tier1 device and/or damage the copper metal interconnection lines of the Tier1 device, during a high-temperature annealing process performed during the manufacturing process of the Tier2 device on the Tier1 device. The thermal shield stack according to various embodiments of the present disclosure also includes only dielectric materials (i.e., the thermal shield stack is electrically insulating) such that vias can be subsequently formed in the thermal shield stack to interconnect the semiconductor devices of the Tier1 device to the semiconductor devices of the Tier2 device. Additionally, the thermal shield stack according to various embodiments of the present disclosure may be thin to enable manufacturing of the vias with a high density and a low aspect ratio.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

With reference now to FIG. 1, a monolithic three-dimensional integrated circuit 100 according to one embodiment of the present disclosure includes a Tier1 device 101 (e.g., a Tier1 wafer or a Tier1 die), a Tier2 device 102 (e.g., a Tier2 wafer or a Tier2 die) stacked on the Tier1 device 101, and a thermal shield stack 103 between the Tier1 device 101 and the Tier2 device 102. In the illustrated embodiment, the Tier1 device 101 and the Tier2 device 102 each include a substrate 104, 105, respectively, a series of semiconductor devices 106, 107 (e.g., p-type field effect transistors (pFETs), n-type FETs (nFETS), an inverter, a NAND gate, a NOR gate, a flip flop, or other logic circuits), respectively, on the respective substrate 104, 105, and a series of vias 108,109 and metal interconnects 110, 111, respectively, on the respective semiconductor devices 106, 107. Additionally, in the illustrated embodiment, the monolithic three-dimensional integrated circuit 100 includes a series of vias 112 in the thermal shield stack 103 connecting the semiconductor devices 106 in the Tier1 device 101 to the semiconductor devices 107 in the Tier2 device 102. In one or more embodiments, the vias 112 may have a pitch of approximately 100 nm.

In one or more embodiments, the overall thickness of the thermal shield stack 103 may be in a range from approximately 30 nm to approximately 500 nm (e.g., the overall thickness of the thermal shield stack 103 may be in a range from approximately 50 nm to approximately 300 nm). In one or more embodiments, the overall thickness of the thermal shield stack 103 may be selected depending on the desired pitch of the vias 112 electrically interconnecting the Tier1 and the Tier2 devices 101, 102 (e.g., the overall thickness of the thermal shield stack 103 may be selected to enable formation of high density vias, such as vias having an approximately 100 nm pitch).

The thermal shield stack 103 is configured to protect the Tier1 device 101 from heat generated during manufacturing of the Tier2 device 102, which might otherwise damage the metal interconnects 110 and/or the semiconductor devices 106 of the Tier1 device 101. For instance, manufacturing the Tier2 device 102 may include performing a high-temperature anneal of the semiconductor devices 107 of the Tier2 device 102 to improve dopant activation efficiency and reliability. In one or more embodiments in which the thermal annealing of the semiconductor devices 107 of the Tier2 device 102 is performed at a temperature of approximately 1,000° C. or greater, the thermal shield stack 103 is configured to prevent the Tier1 device 101 from being exposed to temperature in excess of approximately 400° C. (e.g., the thermal shield stack 103 is configured to maintain the Tier1 device 101 at a temperature of approximately 400° C. or less during the task of thermal annealing of the semiconductor devices 107 of the Tier2 device 102).

In one or more embodiments, the thermal shield stack 103 exhibits anisotropic thermal conductivity characteristics, including high lateral thermal conductivity and poor out-of-plane thermal conductivity, such that the thermal shield stack 103 is configured to both dissipate heat laterally (i.e., sideways) and mitigate against (i.e., retard) the dissipation of heat downward toward the Tier1 device (e.g., the thermal shield stack 103 includes at a thermal spreader portion configured to dissipate heat laterally and a thermal retarder portion configured to mitigate against the dissipation of heat downward toward the Tier1 device 101). Together, the thermal spreader portion and the thermal retarder portion are configured to protect the Tier1 device 101 against excessive heat, such as during fabrication of the Tier2 device 102, which might otherwise damage the metal interconnects 110 and/or the semiconductor devices 106 of the Tier1 device 101. In one or more embodiments, the thermal spreader material and the thermal retarder material may be provided in separate layers (e.g., the thermal shield stack 103 may include a first layer including the thermal retarder material on the Tier1 device 101, and a second layer including the thermal spreader material on the first layer). In one or more embodiments, the thermal spreader material and the thermal retarder material may be provided in the same layer. In one or more embodiments, the thermal spreader material and the thermal retarder material may be the same material or materials (e.g., the thermal shield stack 103 may include one or more materials that function as both a thermal spreader and a thermal retarder).

In one or more embodiments, the thermal shield stack 103 may also be configured to dissipate heat upward toward the Tier2 device 102. The upward dissipation of heat toward the Tier2 device 102 during the task of high-temperature annealing the Tier2 device 102 is configured to improve the device performance of the Tier2 device 102 by improving the dopant activation efficiency and reliability in the semiconductor devices 107 of the Tier2 device 102.

In one or more embodiments, the thermal shield stack 103 may include only dielectric materials (i.e., the thermal shield stack 103 may be electrically insulating). Forming the thermal shield stack 103 out of only dielectric materials improves the manufacturability of the vias 112 compared to related art thermal shields that include electrically conductive materials, such as copper shield layers, which are extremely difficult to etch due to copper's lack of natural volatile compounds.

In one or more embodiments, the thermal spreader material may be Beryllium oxide (BeO), SiC, SiCO, AlN, in-plane hBN, $\alpha$-$Si_3N_4$, and $\beta$-$Si_3N_4$, or combinations thereof. In one or more embodiments, the thermal retarder material may be carbon doped oxide (CDO), out-of-plane hBN, Aerogel, LKD-5109, Orion 2.3, Philk, porous SILK, CF-polymer, porous SiCO, or combinations thereof. In one or more embodiments, the thermal retarder portion and the thermal spreader portion may be a bi-layer stack of materials, such as, for instance, BeO/CDO, AlN/Aerogel, SiC/CDO, AlN/CDO, BeO/Aerogel, SiC/Aerogel, or AlN/Aerogel. In one or more embodiments, the thermal shield stack 103 may include a stack of alternating thermal spreader and thermal retarder layers. For instance, in one or more embodiments, the thermal shield stack 103 may be BeO/CDO/BeO/CDO, AlN/Aerogel/AlN/Aerogel, SiC/CDO/SiC/CDO, BeO/CDO/SiC/CDO, AlN/Aerogel/BeO/CDO, BeO/Aerogel/SiC/CDO, or any other combination of alternating thermal spreader materials and thermal retarder materials.

In one embodiment, the thermal shield stack may include a high porosity carbon doped oxide (CDO) layer and a Beryllium oxide (BeO) layer on (e.g., directly on) the high porosity CDO layer. In one or more embodiments, the high porosity CDO layer may have a thickness in a range from approximately 30 nm to approximately 50 nm. In one or more embodiments, the BeO layer may have a thickness in a range from approximately 5 nm to approximately 30 nm. Additionally, in one or more embodiments, the thermal shield stack 103 may include a dielectric layer, such as, for instance, a $SiO_2$ layer, a silicon carbon nitride (SiCN), and/or a silicon nitride ($Si_3N_4$) layer, on the Tier1 device (e.g., on an uppermost metal interconnect layer 110 of the Tier1 device 101) and below the CDO layer. In one or more embodiments, the dielectric layer may have a thickness in a range from approximately 2 nm to approximately 40 nm. In one or more embodiments, the In one or more embodiments, the thermal shield stack 103 may include a second dielectric layer that is on (e.g., directly on) BeO layer. In one embodiment, the second dielectric layer is between the BeO layer and the substrate 104 of the Tier2 device 101. The second dielectric layer may include any suitable dielectric material, such as, for instance, $SiO_2$, SiCN, and/or $Si_3N_4$. In one or more embodiments, the second dielectric layer may have a thickness in a range from approximately 2 nm to approximately 40 nm. In one or more embodiments, the second dielectric layer may have the same thickness or substantially the same thickness as the first dielectric layer. Additionally, in one or more embodiments, the material composition of the second dielectric layer may be the same as the first dielectric layer.

In one or more embodiments, the thermal shield stack 103 may include a hexagonal boron nitride (hBN) layer. In one or more embodiments, the hBN layer may have a thickness in a range from approximately 5 nm to approximately 100 nm (e.g., the hBN layer may have a thickness in a range from approximately 5 nm to approximately 30 nm). In one or more embodiments, the hBN layer has a hexagonal lattice structure, which causes the hBN layer to exhibit anisotropic thermal conductivity characteristics. Accordingly, the hBN layer is configured to anisotropically dissipate heat generated, for example, during a task of performing the high-temperature anneal of the semiconductor devices 106 of the Tier1 device 101. In one or more embodiments, the hBN layer exhibits very high in-plane thermal conductivity (e.g., a k-value of approximately 400 W/m*K) and very poor out-of-plane thermal conductivity (e.g., a k-value of approximately 5 W/m*K). The very high in-plane thermal conductivity of the hBN layer is configured to diffuse heat sideways (i.e., laterally) away from the Tier1 device 101 and the very poor out-of-plane thermal conductivity of the hBN layer is configured to prevent or at least mitigate against (i.e., retard) the dissipation of heat downward toward the Tier1 device 101. Accordingly, the anisotropic thermal conductivity of the hBN layer is configured to protect the Tier1 device 101 from the heat generated during the task of high-temperature annealing the semiconductor devices 107 of the Tier2 device 102, which might otherwise damage the metal interconnects 110 and/or the semiconductor devices 106 of the Tier1 device 101. In one or more embodiments in which the thermal annealing of the semiconductor devices 107 of the Tier2 device 102 is performed at a temperature of approximately 1,000° C. or greater, the hBN layer of the thermal shield stack 103 is configured to prevent the Tier1 device 101 from being exposed to temperature in excess of approximately 400° C. (e.g., the hBN layer of the thermal shield stack 103 is configured to maintain the Tier1 device 101 at a temperature of approximately 400° C. or less during the task of thermal annealing of the semiconductor devices 107 of the Tier2 device 102). In one or more embodiments, the thermal shield stack 103 may also include a dielectric layer, such as, for instance, a $SiO_2$ layer, a silicon carbon nitride (SiCN), and/or a silicon nitride ($Si_3N_4$) layer, on the Tier1 device 101 (e.g., on an uppermost metal interconnect layer 110 of the Tier1 device 101) and below the hBN layer. In one or more embodiments, the dielectric layer may have a thickness in a range from approximately 2 nm to approximately 40 nm.

FIG. 2 is a flowchart illustrating tasks of a method 200 of manufacturing a monolithic three-dimensional integrated circuit 300 including a Tier1 device 301, a Tier2 device 302 stacked on the Tier1 device 302, and thermal shield stack 303 between the Tier1 device 301 and the Tier2 device 302. FIGS. 3A-3G are schematic views of the layers of the monolithic three-dimensional integrated circuit 300 formed according to the tasks illustrated in FIG. 2.

Figure 3A:
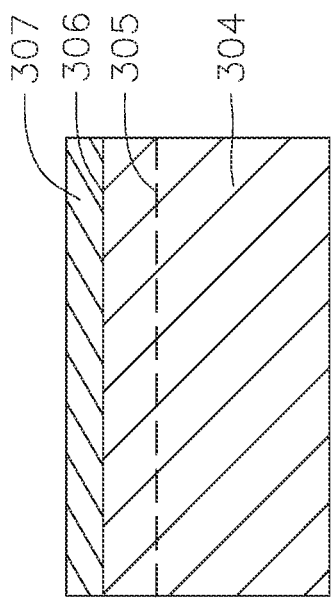
FIGS. 3A-3G are schematic views illustrating the tasks performed according to the method in FIG. 2.

With reference now to the embodiment illustrated in FIGS. 2 and 3A, the method 200 includes a task 205 of forming or obtaining a bare silicon wafer or substrate 304 for the Tier2 device 302. In the illustrated embodiment, the bare silicon wafer 304 is pre-treated with a smart-cut 305 configured to enable de-bonding or separating the bare silicon wafer 304 along the smart-cut 305. The smart-cut 305 may be formed by any suitable manufacturing technique or process now known in the art or hereinafter developed. Smart-cuts are described in M. Bruel et al., "'Smart cut': a promising new SOI material technology," 1995 IEEE International SOI Conference Proceedings, Tucson, Ariz., USA, 1995, pp. 178-179, the entire contents of which are incorporated herein by reference.

In one or more embodiments, the method 200 also includes a task 210 of cleaning an upper surface 306 of the bare silicon wafer 304 to remove any contaminants and native oxides. In one or more embodiments, the bare silicon wafer 304 may be cleaned by performing Standard Clean 1 (SC1) (e.g., cleaning with a solution of deionized water, ammonia ($NH_3$) water, and hydrogen peroxide ($H_2O_2$)) and Standard Clean 2 (SC2) (e.g., cleaning with a solution of deionized water, hydrochloric acid (HCl), and hydrogen peroxide ($H_2O_2$)). In one or more embodiments, the task 210 of cleaning the bare silicon wafer 304 may also include immersing the bare silicon wafer 304 in a solution of hydrofluoric acid (HF) prior to performance of SC2.

Figure 3B:
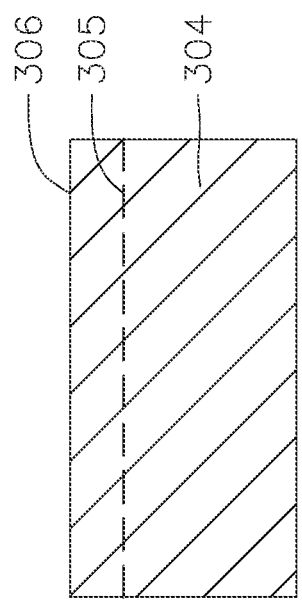

With reference now to the embodiment illustrated in FIGS. 2 and 3B, the method 200 also includes a task 215 of depositing a layer of Beryllium oxide (BeO) 307 on the upper surface 306 of the bare silicon wafer 304. In one or more embodiments, the task 215 of depositing the BeO layer 307 may be performed by atomic layer deposition (ALD). In one or more embodiments, the BeO layer 307 deposited on the upper surface 306 of the bare silicon wafer 304 may have a thickness in a range from approximately 5 nm to approximately 30 nm. In one or more embodiments, the task 215 of depositing the BeO layer 307 on the bare silicon wafer 304 may be performed by the processes disclosed in D. Koh et al., "Investigation of atomic layer deposited beryllium oxide material properties for high-k dielectric applications," J. Va. Sci. Technol. B Nanotechnol. Microelectron. Mater. Process. Meas. Phenom., vol. 32, no. 3, p. 03D117, May 2014 and/or the processes disclosed in S. Min Lee et al, "Advanced Silicon-on-Insulator: Crystalline Silicon on Atomic Layer Deposited Beryllium Oxide," Sci. Rep., vol. 7, no. 1, December 2017, the entire content of each of which is incorporated herein by reference.

Figure 3C:
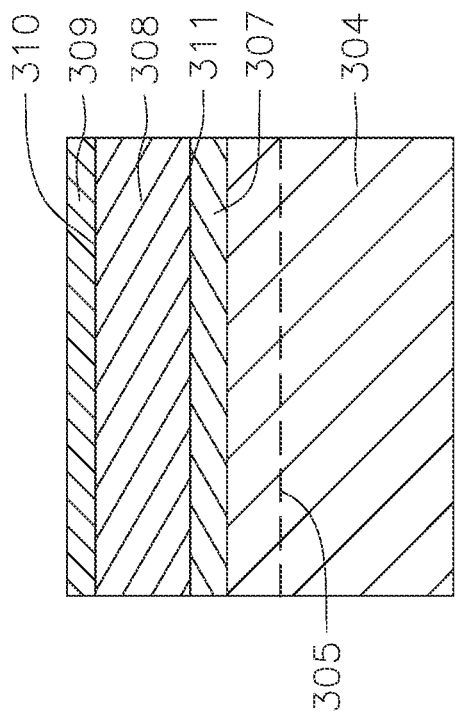

With reference now to the embodiment illustrated in FIGS. 2 and 3C, the method 200 also includes a task 220 of depositing a layer of high porosity carbon-doped oxide (CDO) 308 on the BeO layer 307 formed in task 215 (as shown in FIG. 3B). In one or more embodiments, the CDO layer 308 deposited on top of the BeO layer 307 may have a thickness in a range from approximately 30 nm to approximately 50 nm. Together, the BeO layer 307 and the CDO layer 308 form the thermal shield stack 301. In one or more embodiments, the tasks 215, 220 of depositing the BeO layer 307 and depositing the CDO layer 308 may be repeated to form a multi-tiered stack of alternating BeO and CDO layers 307, 308 (e.g., the tasks 215, 220 of depositing the BeO layer 307 and depositing the CDO layer 308 may be repeated to form a first BeO layer on the bare silicon wafer 304, a first CDO layer on the first BeO layer, a second BeO layer on the first CDO layer, and a second CDO layer on the second BeO layer).

Figure 3D:
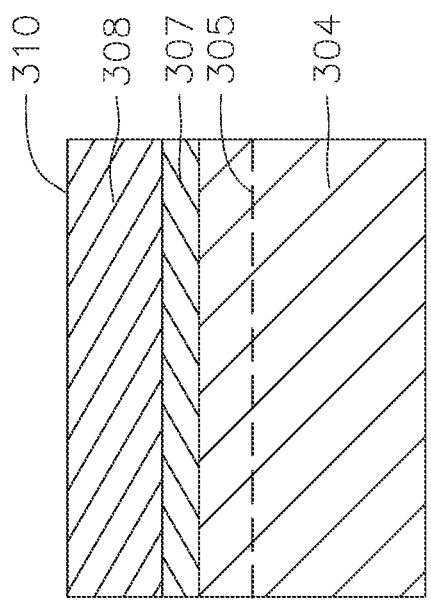

With reference now to the embodiment illustrated in FIGS. 2 and 3D, the method 200 also includes a task 225 of depositing a dielectric layer 309 on an upper surface 310 of the CDO layer 308 formed in task 220 (as shown in FIG. 3C). In one or more embodiments, the dielectric layer 309 may include any suitable dielectric material, such as, for instance, $SiO_2$, silicon carbon nitride (SiCN), and/or silicon nitride ($Si_3N_4$). In one or more embodiments in which the tasks 215, 220 of depositing the BeO layer 307 and depositing the CDO layer 308 are repeated to form a multi-tiered stack of alternating BeO and CDO layers 307, 308, the task 225 of depositing the dielectric layer 309 includes depositing the dielectric layer 309 on the uppermost CDO layer 308 (e.g., the last layer of CDO 308 deposited in task 220). In one or more embodiments, the dielectric layer 309 has a thickness in a range from approximately 2 nm to approximately 20 nm. The dielectric layer 309 is configured to completely cover the upper surface 310 of the CDO layer 308 to cover any pin-holes in the CDO layer 308 formed during the task 220 of depositing the CDO layer 308. Following the task 225 of depositing the dielectric layer 309 on the CDO layer 308, the dielectric layer 309 and the BeO layer 307 are on opposite sides of the CDO layer 308 (e.g., the dielectric layer 309 is on the upper surface 310 of the CDO layer 308 and the BeO layer 307 is on a lower surface 311 of the CDO layer 308 opposite the upper surface 310).

Figure 3F:
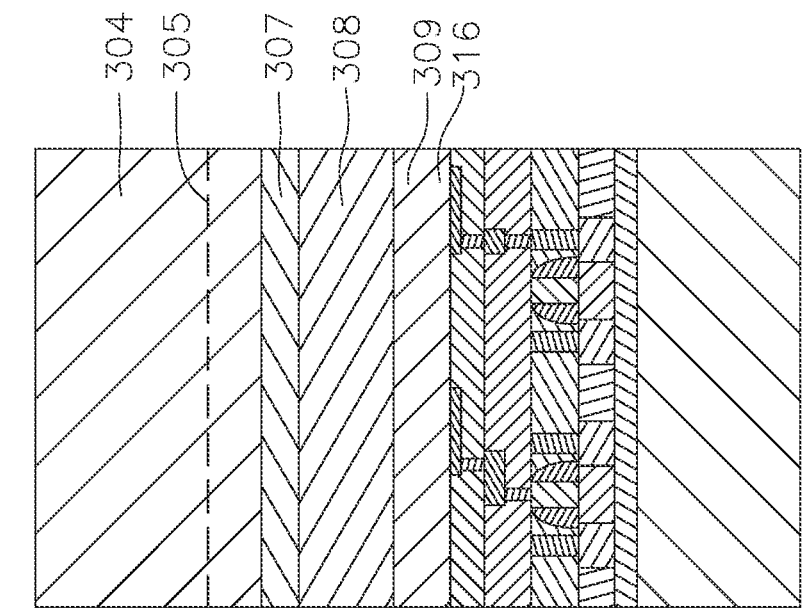
Figure 3E:
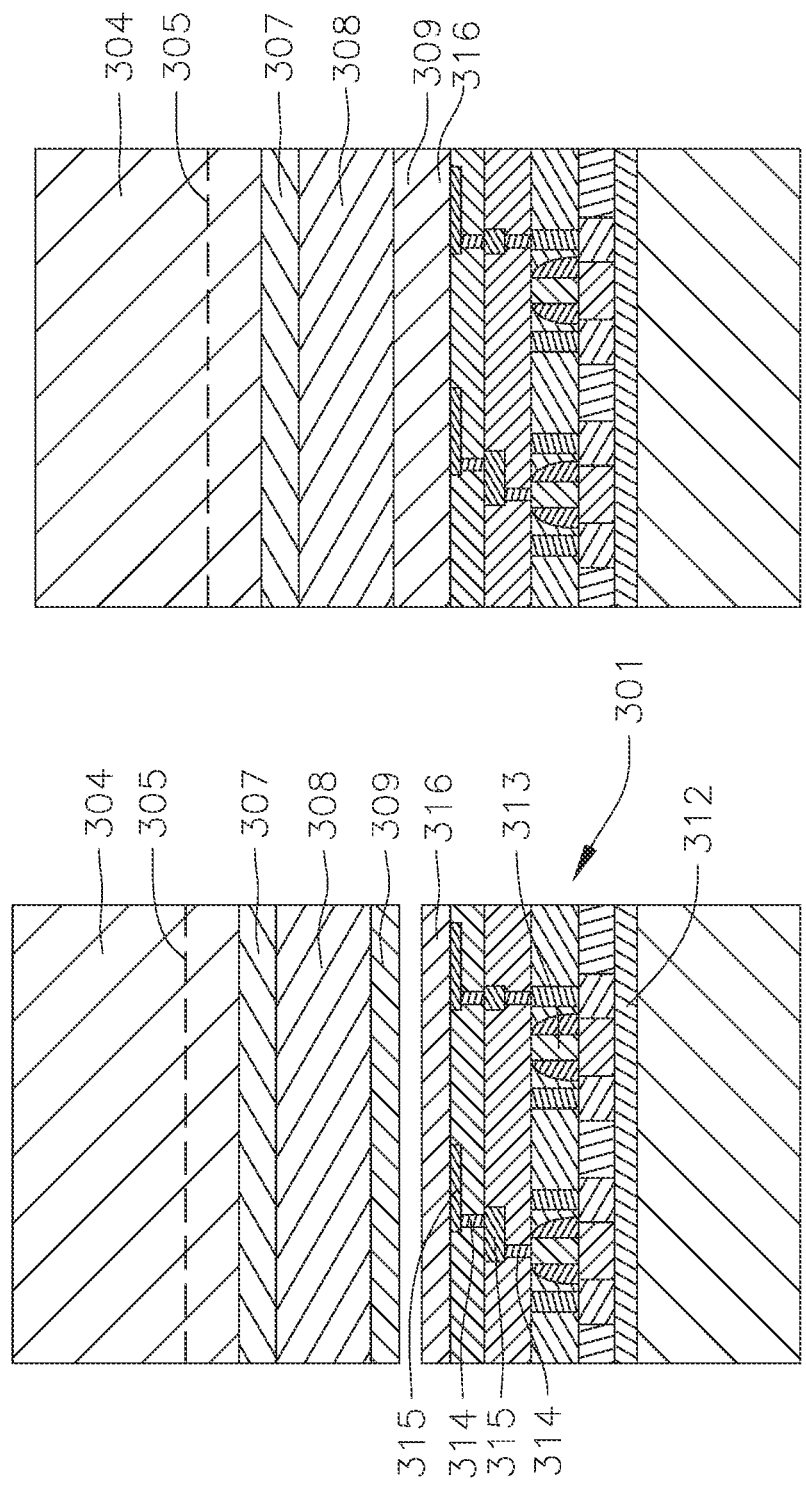

With reference now to the embodiment illustrated in FIGS. 2 and 3E, the method 200 also includes a task 230 of obtaining or manufacturing the Tier1 device 301. In the illustrated embodiment, the Tier1 device 301 includes a substrate 312, a series of semiconductor devices 313 (e.g., p-type field effect transistors (pFETs), n-type FETs (nFETS), an inverter, a NAND gate, a NOR gate, a flip flop, or other logic circuits), on the substrate 312, and a series of vias 314 and metal interconnects 315 on the semiconductor devices 313.

With continued reference to the embodiment illustrated in FIGS. 2 and 3E, the method 200 also includes a task 235 of capping the Tier1 device 301 with a dielectric layer 316 (e.g., depositing the dielectric layer 316 on an uppermost layer, such as an uppermost metal interconnect layer 315, of the Tier1 device 301). In one or more embodiments, the dielectric layer 316 may include any suitable dielectric material, such as, for instance, $SiO_2$, silicon carbon nitride (SiCN), and/or silicon nitride ($Si_3N_4$) In one or more embodiments, the task 235 of capping the Tier1 device 301 with the dielectric layer 316 may include depositing the dielectric layer 316 by any suitable process or processes, such as, for instance, ALD or low-temperature chemical vapor deposition (LT-CVD). In one or more embodiments, the dielectric layer 316 on the Tier1 device 301 may have a thickness in a range from approximately 2 nm to approximately 20 nm. In one or more embodiments, the thickness of the dielectric layer 316 formed on the Tier1 device 301 is the same or substantially the same as the thickness of the dielectric layer 309 formed in task 225 and illustrated in FIG. 2D, although in one or more embodiments, the thickness of the dielectric layer 316 formed on the Tier1 device 301 may be different than the thickness of the dielectric layer 309 formed in task 225 and illustrated in FIG. 2D. Accordingly, following the task of capping the Tier1 device 301 with the dielectric layer 316, the Tier1 device 301 and the wafer 304 for the Tier2 device 302 are both capped with a dielectric layer, which enables bonding between the wafer 304 of the Tier2 device and the Tier1 device 301.

With reference now to the embodiment illustrated in FIGS. 2 and 3F, the method 200 also includes a task 240 of bonding the wafer 304 of the Tier2 device 302 to the Tier1 device 301 by bonding the dielectric layer 316 of the Tier1 device 301 to the dielectric layer 309 of the Tier2 device 302. In one or more embodiments, the task 240 of bonding the dielectric layers 309, 316 together includes performing a low temperature anneal. In one or more embodiments, the temperature of the annealing process utilized to bond the dielectric layers 309, 316 together is adequately high to achieve a bond between the dielectric layers 309, 316, but below an upper temperature threshold that would cause premature de-bonding of the silicon wafer 304 due to activation of the smart-cut 305 in the silicon wafer 304.

Figure 3G:
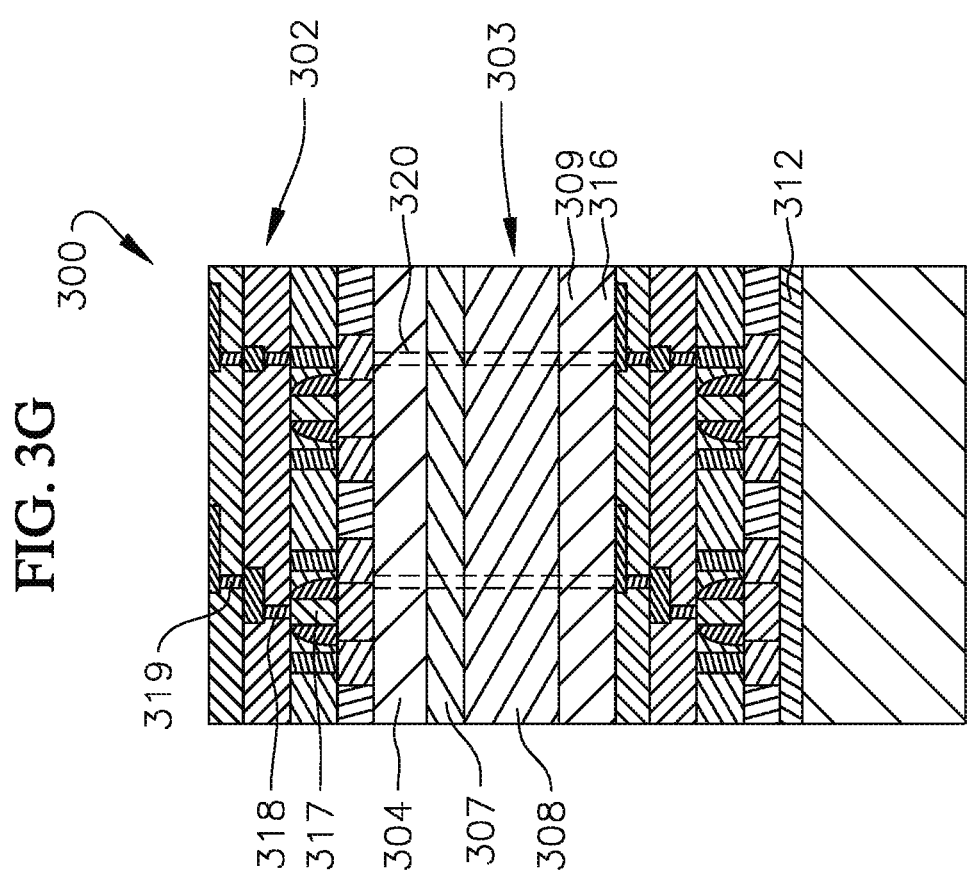

With reference now to the embodiment illustrated in FIGS. 2 and 3G, the method 200 also includes a task 245 of de-bonding the silicon wafer 304 by activating the smart-cut 305 in the silicon wafer 304 to achieve the desired thickness of the silicon wafer 304.

In the illustrated embodiment, the method 200 also includes a task 250 of forming semiconductor devices 317, vias 318, and metal interconnects 319 interconnecting the semiconductor devices 317, on the bare silicon wafer 304 to complete formation of the Tier2 device 302. Additionally, in one or more embodiments, the task 250 of forming the semiconductor devices 317 of the Tier2 device 302 includes performing a high-temperature anneal to improve dopant activation efficiency and reliability in the semiconductor devices 317 of the Tier2 device 302. In one or more embodiments, the high-temperature anneal may include a pulse heating process, a rapid thermal anneal process (RTP), a flash anneal process, or a laser anneal process. In one or more embodiments, the high-temperature anneal may heat the Tier2 device 302, or at least a portion thereof, up to a temperature in a range from approximately 800° C. to approximately 1,250° C. In one or more embodiments, the high-temperature anneal may heat the Tier2 device 302, or at least a portion thereof, up to a temperature of approximately 700° C. or up to approximately 1,000° C. or greater. In one or more embodiments, the high-temperature anneal may heat the Tier2 device 302, or at least a portion thereof, for a duration in a range from approximately one nanosecond to approximately one second.

Furthermore, in the illustrated embodiment, the method 200 includes a task 255 of forming vias 320 in the thermal shield stack 303 connecting the semiconductor devices 317 in the Tier2 device 302 to the semiconductor devices 313 in the Tier1 device 301. In one or more embodiments, the task 255 of forming the vias 320 in the thermal shield stack 303 includes etching the BeO layer 307 and the CDO layer 308. Suitable processes for etching the BeO layer 307 are described in K. S. Min et al., "Atomic layer etching of BeO using BCl3/Ar for the interface passivation layer of III-V MOS devices," Microelectron. Eng., vol. 114, pp. 121-125, February 2014, the entire content of which is incorporated herein by reference. The task of etching the CDO layer 308 may be performed utilizing a standard back-end-of-line (BEOL) process. In one or more embodiments, the thickness of the thermal shield stack 303 (e.g., the thicknesses of the BeO layer 307 and the CDO layer 308) may be selected depending on the desired configuration of the vias 320. Additionally, unlike related art thermal shield stacks that include a copper (Cu) layer, which is difficult to etch to form vias, the thermal shield stack 303 according to the embodiment illustrated in FIG. 3G does not include a copper layer, which improves manufacturability of the vias 320 compared to the related art thermal shield stacks.

In one or more embodiments, the monolithic three-dimensional integrated circuit 300 including the Tier1 device 301, the Tier2 device 302 stacked on the Tier1 device 301, and the thermal shield stack 303 between the Tier1 device 301 and the Tier2 device 302 is complete following the task 250 of forming semiconductor devices 317, the vias 318, and the metal interconnects 319 of the Tier2 device 302 and the task 255 of forming the vias 320 in the thermal shield stack 303.

The thermal shield stack 303 is configured to protect the semiconductor devices 313 and the metal interconnect layers 315 of the Tier1 device 301 during the task of performing a high-temperature anneal (e.g., annealing, such as by pulse heating, at a temperature of approximately 1,000° C. or greater) to improve dopant activation efficiency and reliability in the semiconductor devices 317 of the Tier2 device 302. In the illustrated embodiment, the BeO layer 307 is configured to dissipate heat, in a isotropic manner, generated during the task of performing the high-temperature anneal of the semiconductor devices 317 of the Tier2 device 302 (e.g., the BeO layer 307 is configured to dissipate heat in all directions, including upward, downward, and sideways). The BeO layer 307 exhibits very high thermal conductivity (e.g., a k-value of approximately 370 W/m*K). The upward transfer of the heat toward the Tier2 device 302 by the BeO layer 307 and the bare silicon wafer 304 on the BeO layer 307, which is also highly conductive, improves the device performance of the Tier2 device 302 by improving the dopant activation efficiency and reliability in the semiconductor devices 317 of the Tier2 device 302. The sideways (i.e., lateral) diffusion of heat by the BeO layer 307 is configured to reduce the amount of thermal energy transferred downward toward the Tier1 device 301, which might otherwise damage the semiconductor devices 313 and/or the metal interconnect layers 315 of the Tier1 device 301. In contrast, CDO layer 308 exhibits very poor thermal conductivity (e.g., a k-value in a range from approximately 0.3 W/m*K to approximately 1.4 W/m*K). Accordingly, the CDO layer 308, which has poor thermal conductivity, is configured to block or at least reduce the downward dissipation of thermal energy (i.e., heat) into the Tier1 device 301. That is, together, the BeO layer 307 (which conducts heat isotropically, including laterally) and the CDO layer 308 (which has poor conductivity) are configured to protect the Tier1 device 301 from the heat generated during the task of high-temperature annealing of the semiconductor devices 317 of the Tier2 device 302. In one or more embodiments in which the thermal annealing of the semiconductor devices 317 of the Tier2 device 302 is performed at a temperature of approximately 1,000° C. or greater, the thermal shield stack 303 is configured to prevent the Tier1 device 301 from being exposed to temperature in excess of approximately 400° C. (e.g., the thermal shield stack 303 is configured to maintain the Tier1 device 301 at a temperature of approximately 400° C. or less during the task of thermal annealing of the semiconductor devices 317 of the Tier2 device 302). Additionally, unlike related art devices that include a layer of low thermal conductivity $SiO_2$ between the thermal shield stack and the semiconductor devices above the thermal shield stack that impedes the upward transfer of heat, the thermal shield stack 303 according to the embodiment illustrated in FIG. 3G does not include a layer of $SiO_2$ between the BeO layer 307 of the thermal shield stack 303 and the silicon wafer 304, which permits the upward dissipation of heat to the semiconductor devices 317 of the Tier2 device 302 during the task of high-temperature annealing, and thereby improves dopant activation efficiency and reliability in the semiconductor devices 317 of the Tier2 device 302. Thus, the thermal shield stack 303 according to the embodiment illustrated in FIG. 3G is configured to both promote the upward transfer of heat to the Tier2 device 302 during the task of annealing the semiconductor devices 317 in the Tier2 device 302, which improves the performance of the semiconductor devices 317 by improving dopant activation efficiency and reliability, while also mitigating against the downward dissipation of heat, which might damage the damage the metal interconnects 315 and/or the semiconductor devices 313 of the Tier1 device 301.

FIG. 4 is a flowchart illustrating tasks of a method 400 of manufacturing a monolithic three-dimensional integrated circuit 500 including a Tier1 device 501, a Tier2 device 502 stacked on the Tier1 device 501, and thermal shield stack 503 between the Tier1 device 501 and the Tier2 device 502 according to another embodiment of the present disclosure. FIGS. 5A-5F are schematic views of the layers of the monolithic three-dimensional integrated circuit 500 formed according to the tasks illustrated in FIG. 4.

Figure 5A:
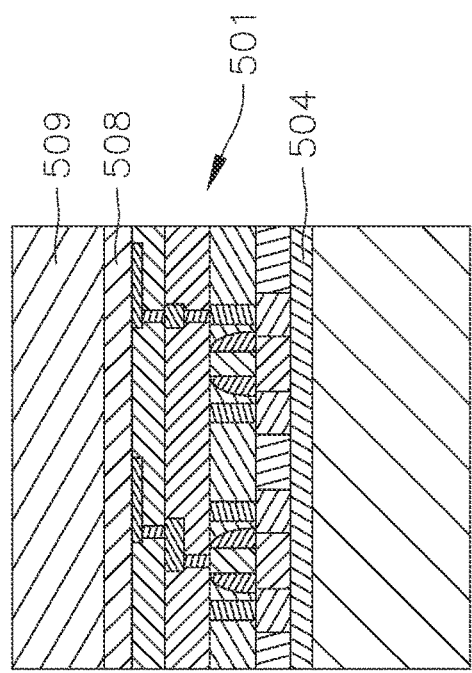

With reference now to the embodiment illustrated in FIGS. 4 and 5A, the method 400 includes a task 405 of obtaining or manufacturing the Tier1 device 501. In the illustrated embodiment, the Tier1 device 501 includes a substrate 504, a series of semiconductor devices 505 (e.g., p-type field effect transistors (pFETs), n-type FETs (nFETS), an inverter, a NAND gate, a NOR gate, a flip flop, or other logic circuits), on the substrate 504, and a series of vias 506 and metal interconnects 507 on the semiconductor devices 505.

With continued reference to the embodiment illustrated in FIGS. 4 and 5A, the method 400 also includes a task 410 of capping the Tier1 device 501 with a dielectric layer 508 (e.g., depositing the dielectric layer 508 on an uppermost layer, such as an uppermost metal interconnect layer 507, of the Tier1 device 501). In one or more embodiments, the dielectric layer 508 may include any suitable dielectric material, such as, for instance, $SiO_2$, silicon carbon nitride (SiCN), and/or silicon nitride ($Si_3N_4$). In one or more embodiments, the task 410 of capping the Tier1 device 501 with the dielectric layer 508 may include depositing the dielectric layer 508 by any suitable process or processes, such as, for instance, ALD or low-temperature chemical vapor deposition (LT-CVD). In one or more embodiments, the dielectric layer 508 on the Tier1 device 501 may have a thickness in a range from approximately 2 nm to approximately 20 nm.

Figure 5B:
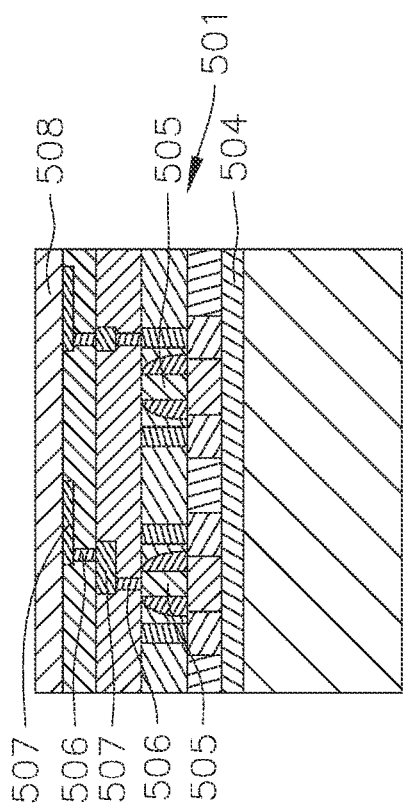

With reference now to the embodiment illustrated in FIGS. 4 and 5B, the method 400 also includes a task 415 of depositing a layer of high porosity carbon-doped oxide (CDO) 509 on the dielectric layer 508 formed in task 410 and shown in FIG. 5A. In one or more embodiments, the CDO layer 509 deposited on top of the dielectric layer 508 may have a thickness in a range from approximately 10 nm to approximately 100 nm (e.g., the CDO layer 509 may have a thickness in a range from approximately 30 nm to approximately 50 nm).

Figure 5C:
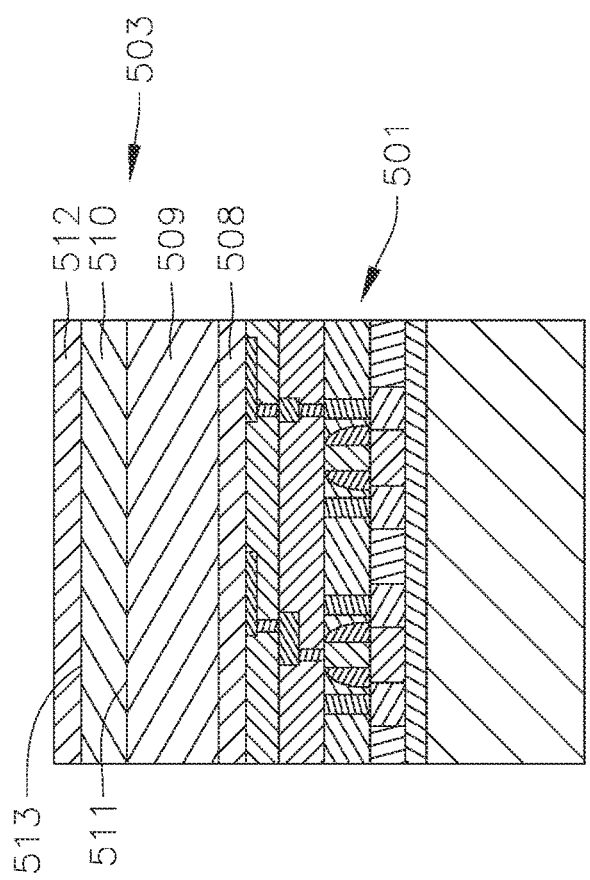

With reference now to the embodiment illustrated in FIGS. 4 and 5C, the method 400 also includes a task 420 of depositing a layer of Beryllium oxide (BeO) 510 on an upper surface 511 of the CDO layer 509 formed in task 415 and shown in FIG. 5B. In one or more embodiments, the task of depositing the BeO layer 510 may be performed by atomic layer deposition (ALD). In one or more embodiments, the BeO layer 510 deposited on the upper surface of the CDO layer 509 may have a thickness in a range from approximately 5 nm to approximately 100 nm (e.g., the BeO layer 510 may have a thickness in a range from approximately 5 nm to approximately 30 nm). In one or more embodiments, the task 420 of depositing the BeO layer 510 on the CDO layer 509 may be performed by the processes disclosed in D. Koh et al., "Investigation of atomic layer deposited beryllium oxide material properties for high-k dielectric applications," J. Va. Sci. Technol. B Nanotechnol. Microelectron. Mater. Process. Meas. Phenom., vol. 32, no. 3, p. 03D117, May 2014 and/or the processes disclosed in S. Min Lee et al, "Advanced Silicon-on-Insulator: Crystalline Silicon on Atomic Layer Deposited Beryllium Oxide," Sci. Rep., vol. 7, no. 1, December 2017, the entire content of each of which is incorporated herein by reference. The BeO layer 510 is configured to completely cover the upper surface 511 of the CDO layer 509 to cover any pin-holes in the CDO layer 509 formed during the task 415 of depositing the CDO layer 509.

Together, the CDO layer 509 and the BeO layer 510 form the thermal shield stack 503. In one or more embodiments, the tasks 415, 420 of depositing the CDO layer 509 and depositing the BeO layer 510 may be repeated to form a multi-tiered stack of alternating CDO and BeO layers 509, 510 (e.g., the tasks 415, 420 of depositing the CDO layer 509 and depositing the BeO layer 510 may be repeated to form a first layer of CDO on the dielectric layer 508, a first layer of BeO on the first layer of CDO, a second layer of CDO on the first layer of BeO, and a second layer of BeO on the second layer of CDO). In one or more embodiments, the multi-tiered stack may include any other suitable number of CDO and BeO layers 509, 510, such as, for instance, three or more CDO layers 509 and three or more BeO layers 510.

With continued reference to the embodiment illustrated in FIGS. 4 and 5C, the method 400 also includes a task 425 of depositing a dielectric layer 512 on an upper surface 513 of the BeO layer 510 formed in task 420. In one or more embodiments, the dielectric layer 512 may include any suitable dielectric material, such as, for instance, $SiO_2$, silicon carbon nitride (SiCN), and/or silicon nitride ($Si_3N_4$). In one or more embodiments in which the tasks 415, 420 of depositing the CDO layer 509 and depositing the BeO layer 510 are repeated to form a multi-tiered stack of alternating CDO and BeO layers, the task of depositing the dielectric layer 512 includes depositing the dielectric layer 512 on the uppermost BeO layer (e.g., the last layer of BeO deposited in task 420). In one or more embodiments, the dielectric layer 512 has a thickness in a range from approximately 2 nm to approximately 20 nm.

Figure 5D:
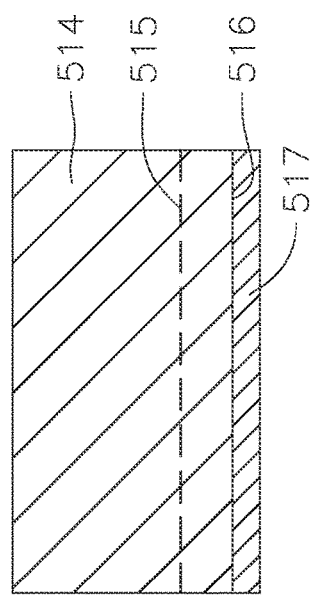

With reference now to the embodiment illustrated in FIGS. 4 and 5D, the method 400 includes a task 430 of forming or obtaining a bare silicon wafer or substrate 514 for the Tier2 device 502. In the illustrated embodiment, the bare silicon wafer 514 is pre-treated with a smart-cut 515 configured to enable de-bonding or separating the bare silicon wafer 514 along the smart-cut 515. The smart-cut 515 may be formed by any suitable manufacturing technique or process now known in the art or hereinafter developed. Smart-cuts are described in M. Bruel et al., "'Smart cut': a promising new SOI material technology," 1995 IEEE International SOI Conference Proceedings, Tucson, Ariz., USA, 1995, pp. 178-179, the entire contents of which are incorporated herein by reference.

In one or more embodiments, the method 400 also includes a task 435 of cleaning a lower surface 516 of the bare silicon wafer 514 to remove any contaminants and native oxides. In one or more embodiments, the bare silicon wafer 514 may be cleaned by performing Standard Clean step 1 (SC1) (e.g., cleaning with a solution of deionized water, ammonia ($NH_3$) water, and hydrogen peroxide ($H_2O_2$)) and Standard Clean step 2 (SC2) (e.g., cleaning with a solution of deionized water, hydrochloric acid (HCl), and hydrogen peroxide ($H_2O_2$)). In one or more embodiments, the task 435 of cleaning the bare silicon wafer 514 may also include immersing the bare silicon wafer 514 in a solution of hydrofluoric acid (HF) prior to performance of SC2.

With continued reference to the embodiment illustrated in FIGS. 4 and 5D, the method 400 also includes a task 440 of forming a dielectric layer 517 on the lower surface 516 of the bare silicon wafer 514. In one or more embodiments, the dielectric layer 517 may include any suitable dielectric material, such as, for instance, $SiO_2$, silicon carbon nitride (SiCN), and/or silicon nitride ($Si_3N_4$). In one or more embodiments, the task 440 of depositing the dielectric layer 517 may be performed by any suitable process or processes, such as, for instance, ALD or low-temperature chemical vapor deposition (LT-CVD). In one or more embodiments, the dielectric layer 517 on the bare silicon wafer 514 may have a thickness in a range from approximately 2 nm to approximately 20 nm. In one or more embodiments, the thickness of the dielectric layer 517 formed on the bare silicon wafer 514 is the same or substantially the same as the thickness of the dielectric layer 512 formed on the BeO layer 510 in task 425 and illustrated in FIG. 5C, although in one or more embodiments, the thickness of the dielectric layer 512 formed on the bare silicon wafer 514 may be different than the thickness of the dielectric layer 512 formed in task 425 and illustrated in FIG. 5C. Accordingly, following the task 440 of forming the dielectric layer 517 on the bare silicon wafer 514, the Tier1 device 501 and the silicon wafer 514 for the Tier2 device 502 are both capped with a dielectric layer, which enables bonding between the wafer 514 of the Tier2 device 502 and the Tier1 device 501.

With reference now to the embodiment illustrated in FIGS. 4 and 5E, the method 400 also includes a task 445 of bonding the wafer 514 of the Tier2 device 502 to the Tier1 device 501 by bonding the dielectric layer 512 of the Tier1 device 501 to the dielectric layer 517 of the Tier2 device 502. In one or more embodiments, the task 445 of bonding the dielectric layers 512, 517 together includes performing a low temperature anneal. In one or more embodiments, the temperature of the annealing process utilized to bond the dielectric layers 512, 517 together is adequately high to achieve a bond between the dielectric layers 512, 517, but below an upper temperature threshold that would cause premature de-bonding of the silicon wafer 514 due to activation of the smart-cut 515 in the silicon wafer 514.

With reference now to the embodiment illustrated in FIGS. 4 and 5F, the method 400 also includes a task 450 of de-bonding the silicon wafer 514 by activating the smart-cut 515 in the silicon wafer 514 to achieve the desired thickness of the silicon wafer 514.

In the illustrated embodiment, the method 400 also includes a task 455 of forming semiconductor devices 518, vias 519, and metal interconnects 520 interconnecting the semiconductor devices 518, on the bare silicon wafer 514 to complete formation of the Tier2 device 502. Additionally, in one or more embodiments, the task 455 of forming the semiconductor devices 518 of the Tier2 device 502 includes performing a high-temperature anneal to improve dopant activation efficiency and reliability in the semiconductor devices 518 of the Tier2 device 502. In one or more embodiments, the high-temperature anneal may include a pulse heating process, a rapid thermal anneal process (RTP), a flash anneal process, or a laser anneal process. In one or more embodiments, the high-temperature anneal may heat the Tier2 device 502, or at least a portion thereof, up to a temperature in a range from approximately 800° C. to approximately 1,250° C. In one or more embodiments, the high-temperature anneal may heat the Tier2 device 502, or at least a portion thereof, up to a temperature of approximately 700° C. or up to approximately 1,000° C. or greater. In one or more embodiments, the high-temperature anneal may heat the Tier2 device 502, or at least a portion thereof, for a duration in a range from approximately one nanosecond to approximately one second.

Furthermore, in the illustrated embodiment, the method 400 includes a task 460 of forming vias 521 in the thermal shield stack 503 connecting the semiconductor devices 518 in the Tier2 device 502 to the semiconductor devices 505 in the Tier1 device 501. In one or more embodiments, the task 460 of forming the vias 521 in the thermal shield stack 503 includes etching the BeO layer 510 and the CDO layer 509. Suitable processes for etching the BeO layer 510 are described in K. S. Min et al., "Atomic layer etching of BeO using BCl3/Ar for the interface passivation layer of III-V MOS devices," Microelectron. Eng., vol. 114, pp. 121-125, February 2014, the entire content of which is incorporated herein by reference. The task of etching the CDO layer 509 may be performed utilizing a standard back-end-of-line (BEOL) process. In one or more embodiments, the thickness of the thermal shield stack 503 (e.g., the thicknesses of the BeO layer 510 and the CDO layer 509) may be selected depending on the desired configuration of the vias 521. Additionally, unlike related art thermal shield stacks that include a copper (Cu) layer, which is difficult to etch to form vias, the thermal shield stack 503 according to the embodiment illustrated in FIG. 5F does not include a copper layer, which improves manufacturability of the vias 521 compared to the related art thermal shield stacks.

In one or more embodiments, the monolithic three-dimensional integrated circuit 500 including the Tier1 device 501, the Tier2 device 502 stacked on the Tier1 device 501, and the thermal shield stack 503 between the Tier1 device 501 and the Tier2 device 502 is complete following the task 455 of forming semiconductor devices 518, the vias 519, and the metal interconnects 520 of the Tier2 device 502 and the task 460 of forming the vias 521 in the thermal shield stack 503.

The thermal shield stack 503 is configured to protect the semiconductor devices 505 and the metal interconnect layers 507 of the Tier1 device 501 during the task of performing a high-temperature anneal (e.g., annealing, such as by pulse heating, at a temperature of approximately 1,000° C. or greater) to improve dopant activation efficiency and reliability in the semiconductor devices 518 of the Tier2 device 502. In the illustrated embodiment, the BeO layer 510 is configured to dissipate heat, in a isotropic manner, generated during the task of performing the high-temperature anneal of the semiconductor devices 518 of the Tier2 device 502 (e.g., the BeO layer 510 is configured to dissipate heat in all directions, including upward, downward, and sideways). The BeO layer 510 exhibits very high thermal conductivity (e.g., a k-value of approximately 370 W/m*K). The upward transfer of the heat toward the Tier2 device 502 by the BeO layer 510 and the bare silicon wafer 514 on the BeO layer 510, which is also highly conductive, improves the device performance of the Tier2 device 502 by improving the dopant activation efficiency and reliability in the semiconductor devices 518 of the Tier2 device 502. The sideways (i.e., lateral) diffusion of heat by the BeO layer 510 is configured to reduce the amount of thermal energy transferred downward toward the Tier1 device 501, which might otherwise damage the semiconductor devices 505 and/or the metal interconnect layers 507 of the Tier1 device 501. In contrast, CDO layer 509 exhibits very poor thermal conductivity (e.g., a k-value in a range from approximately 0.3 W/m*K to approximately 1.4 W/m*K). Accordingly, the CDO layer 509, which has poor thermal conductivity, is configured to block or at least reduce the downward dissipation of thermal energy (i.e., heat) into the Tier1 device 501. That is, together, the BeO layer 510 (which conducts heat isotropically, including laterally) and the CDO layer 509 (which has poor conductivity) are configured to protect the Tier1 device 501 from the heat generated during the task of high-temperature annealing of the semiconductor devices 518 of the Tier2 device 502. In one or more embodiments in which the thermal annealing of the semiconductor devices 518 of the Tier2 device 502 is performed at a temperature of approximately 1,000° C. or greater, the thermal shield stack 503 is configured to prevent the Tier1 device 501 from being exposed to temperature in excess of approximately 400° C. (e.g., the thermal shield stack 503 is configured to maintain the Tier1 device 501 at a temperature of approximately 400° C. or less during the task of thermal annealing of the semiconductor devices 318 of the Tier2 device 502). Thus, the thermal shield stack 503 according to the embodiment illustrated in FIG. 5F is configured to both promote the upward transfer of heat to the Tier2 device 502 during the task of annealing the semiconductor devices 318 in the Tier2 device 502, which improves the performance of the semiconductor devices 318 by improving dopant activation efficiency and reliability, while also mitigating against the downward dissipation of heat, which might damage the damage the metal interconnects 507 and/or the semiconductor devices 505 of the Tier1 device 501.

FIG. 6 is a flowchart illustrating tasks of a method 600 of manufacturing a monolithic three-dimensional integrated circuit 700 including a Tier1 device 701, a Tier2 device 702 stacked on the Tier1 device 701, and thermal shield stack 703 between the Tier1 device 701 and the Tier2 device 702 according to another embodiment of the present disclosure. FIGS. 7A-7F are schematic views of the layers of the monolithic three-dimensional integrated circuit 700 formed according to the tasks illustrated in FIG. 6.

Figure 7A:
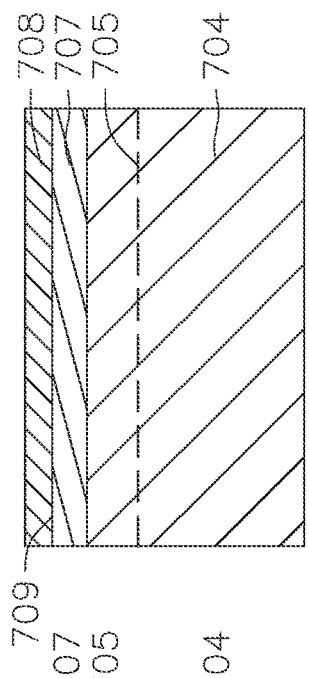
FIGS. 7A-7F are schematic views illustrating the tasks performed according to the method in FIG. 6.

With reference now to the embodiment illustrated in FIGS. 6 and 7A, the method 600 includes a task 605 of forming or obtaining a bare silicon wafer or substrate 704 for the Tier2 device 702. In the illustrated embodiment, the bare silicon wafer 704 is pre-treated with a smart-cut 705 configured to enable de-bonding or separating the bare silicon wafer 704 along the smart-cut 705. The smart-cut 705 may be formed by any suitable manufacturing technique or process now known in the art or hereinafter developed. Smart-cuts are described in M. Bruel et al., "'Smart cut': a promising new SOI material technology," 1995 IEEE International SOI Conference Proceedings, Tucson, Ariz., USA, 1995, pp. 178-179, the entire contents of which are incorporated herein by reference.

In one or more embodiments, the method 600 also includes a task 610 of cleaning an upper surface 706 of the bare silicon wafer 704 to remove any contaminants and native oxides. In one or more embodiments, the bare silicon wafer 704 may be cleaned utilizing an in-situ low temperature native oxide removal process, such as, for instance, SiCoNi or vapor hydrofluoric acid (HF). A suitable SiCoNi process for the removal native oxides from the bare silicon wafer 704 is described R. Yang, N. Su, P. Bonfanti, J. Nie, J. Ning, and T. T. Li, "Advanced in situ pre-Ni silicide (Siconi) cleaning at 65 nm to resolve defects in NiSi [sub x] modules," J. Vac. Sci. Technol. B Microelectron. Nanometer Struct., vol. 28, no. 1, p. 56, 2010, the entire content of which is incorporated herein by reference. The low temperature oxide removal task is configured to avoid prematurely activating the smart-cut 705 in the bare silicon wafer 704, which might otherwise occur with a high temperature anneal task.

Figure 7B:
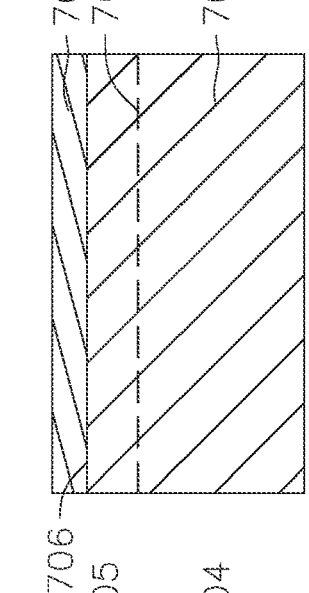

With reference now to the embodiment illustrated in FIGS. 6 and 7B, the method 600 also includes a task 615 of forming a layer of hexagonal boron nitride (hBN) 707 on the upper surface 706 of the bare silicon wafer 704. In one or more embodiments, the hBN layer 707 may be epitaxially grown on the upper surface 706 of the bare silicon wafer 704 utilizing an electron-enhanced atomic layer deposition (EE-ALD) method. In one or more embodiments, the hBN layer 707 deposited on the upper surface 706 of the bare silicon wafer 704 may have a thickness in a range from approximately 5 nm to approximately 100 nm (e.g., the hBN layer 707 may have a thickness in a range from approximately 5 nm to approximately 30 nm). In one or more embodiments, the task 615 of depositing the hBN layer 707 on the bare silicon wafer 704 may be performed by the processes disclosed in J. K. Sprenger, H. Sun, A. S. Cavanagh, A. Roshko, P. T. Blanchard, and S. M. George, "Electron-Enhanced Atomic Layer Deposition of Boron Nitride Thin Films at Room Temperature and 100° C.," J. Phys. Chem. C, vol. 122, no. 17, pp. 9455-9464, May 2018, the entire content of each of which is incorporated herein by reference. Cleaning the upper surface 706 of the bare silicon wafer 704, as described above in task 610, enables the epitaxial growth of the hBN layer 707 on the silicon wafer 704. Additionally, forming the hBN layer 707 in an epitaxial manner causes the hBN layer 707 to have a hexagonal lattice structure, which in turn causes the hBN layer 707 to exhibit anisotropic thermal conductivity characteristics, the significance of which is described below.

Figure 7C:
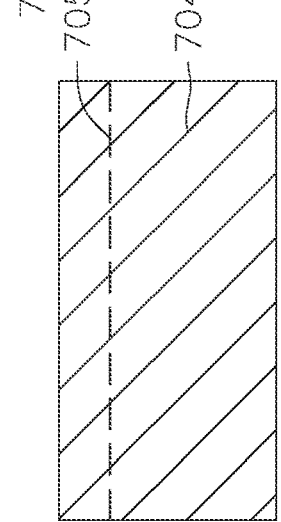

With reference now to the embodiment illustrated in FIGS. 6 and 7C, the method 600 also includes a task 620 of depositing a dielectric layer 708 on an upper surface 709 of the layer of hBN layer 707 formed in task 615. In one or more embodiments, the dielectric layer 708 may include any suitable dielectric material, such as, for instance, $SiO_2$, silicon carbon nitride (SiCN), and/or silicon nitride ($Si_3N_4$). In one or more embodiments, the dielectric layer 708 has a thickness in a range from approximately 2 nm to approximately 20 nm. Together, the hBN layer 707 and the dielectric layer 708 on the hBN layer 707 define the thermal shield stack 703.

Figure 7E:
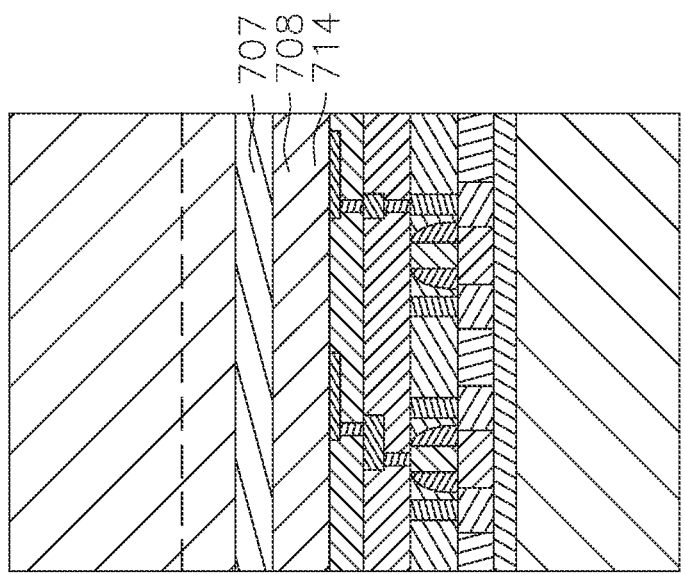
Figure 7D:
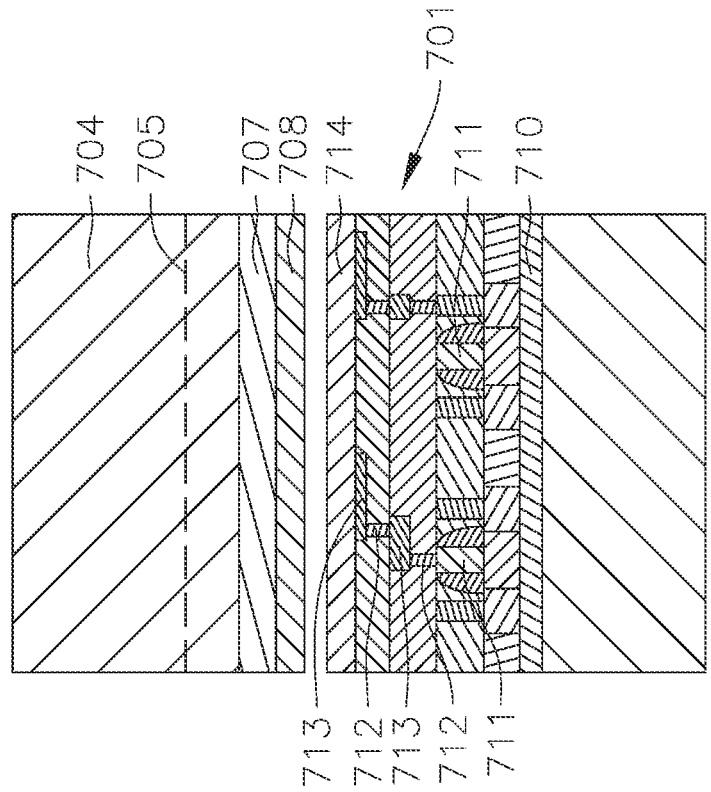

With reference now to the embodiment illustrated in FIGS. 6 and 7D, the method 600 also includes a task 625 of obtaining or manufacturing the Tier1 device 701. In the illustrated embodiment, the Tier1 device 701 includes a substrate 710, a series of semiconductor devices 711 (e.g., p-type field effect transistors (pFETs), n-type FETs (nFETS), an inverter, a NAND gate, a NOR gate, a flip flop, or other logic circuits), on the substrate 710, and a series of vias 712 and metal interconnects 713 on the semiconductor devices 711.

With continued reference to the embodiment illustrated in FIGS. 6 and 7D, the method 600 also includes a task 630 of capping the Tier1 device 701 with a dielectric layer 714 (e.g., depositing the dielectric layer 714 on an uppermost layer, such as an uppermost metal interconnect layer 713, of the Tier1 device 701). In one or more embodiments, the dielectric layer 714 may include any suitable dielectric material, such as, for instance, $SiO_2$, silicon carbon nitride (SiCN), and/or silicon nitride ($Si_3N_4$) In one or more embodiments, the task 630 of capping the Tier1 device 701 with the dielectric layer 714 may include depositing the dielectric layer 714 by any suitable process or processes, such as, for instance, ALD or low-temperature chemical vapor deposition (LT-CVD). In one or more embodiments, the dielectric layer 714 on the Tier1 device 701 may have a thickness in a range from approximately 2 nm to approximately 20 nm. In one or more embodiments, the thickness of the dielectric layer 714 formed on the Tier1 device 701 is the same or substantially the same as the thickness of the dielectric layer 708 formed in task 620 and illustrated in FIG. 7C, although in one or more embodiments, the thickness of the dielectric layer 714 formed on the Tier1 device 701 may be different than the thickness of the dielectric layer 708 formed in task 620 and illustrated in FIG. 7C. Accordingly, following the task of capping the Tier1 device 701 with the dielectric layer 714, the Tier1 device 701 and the wafer 704 for the Tier2 device 702 are both capped with a dielectric layer 714, 708, respectively, which enables bonding between the wafer 704 of the Tier2 device 702 and the Tier1 device 701.

With reference now to the embodiment illustrated in FIGS. 6 and 7E, the method 600 also includes a task 635 of bonding the wafer 704 of the Tier2 device 702 to the Tier1 device 701 by bonding the dielectric layer 714 of the Tier1 device 701 to the dielectric layer 708 of the Tier2 device 702. In one or more embodiments, the task 635 of bonding the dielectric layers 714, 708 together includes performing a low temperature anneal. In one or more embodiments, the temperature of the annealing process utilized to bond the dielectric layers 714, 708 together is adequately high to achieve a bond between the dielectric layers 714, 708, but below an upper temperature threshold that would cause premature de-bonding of the silicon wafer 704 due to activation of the smart-cut 705 in the silicon wafer 304.

Figure 7F:
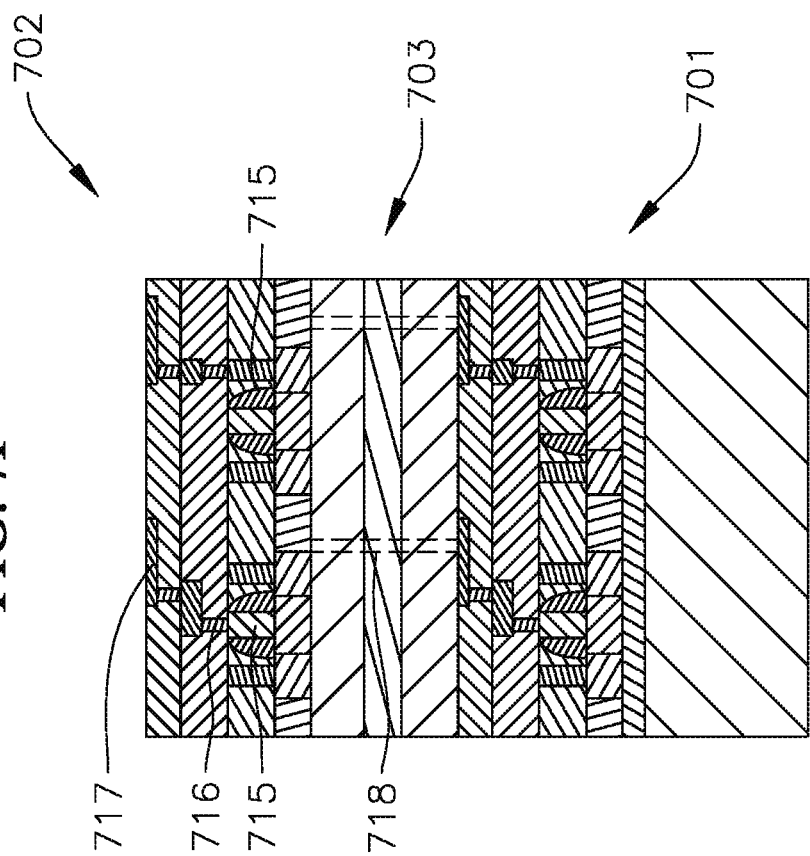

With reference now to the embodiment illustrated in FIGS. 6 and 7F, the method 600 also includes a task 640 of de-bonding the silicon wafer 704 by activating the smart-cut 705 in the silicon wafer 704 to achieve the desired thickness of the silicon wafer 704.

In the illustrated embodiment, the method 600 also includes a task 645 of forming semiconductor devices 715, vias 716, and metal interconnects 717 interconnecting the semiconductor devices 715, on the bare silicon wafer 704 to complete formation of the Tier2 device 702. Additionally, in one or more embodiments, the task 645 of forming the semiconductor devices 715 of the Tier2 device 702 includes performing a high-temperature anneal to improve dopant activation efficiency and reliability in the semiconductor devices 715 of the Tier2 device 702. In one or more embodiments, the high-temperature anneal may include a pulse heating process, a rapid thermal anneal process (RTP), a flash anneal process, or a laser anneal process. In one or more embodiments, the high-temperature anneal may heat the Tier2 device 702, or at least a portion thereof, up to a temperature in a range from approximately 800° C. to approximately 1,250° C. In one or more embodiments, the high-temperature anneal may heat the Tier2 device 702, or at least a portion thereof, up to a temperature of approximately 700° C. or up to approximately 1,000° C. or greater. In one or more embodiments, the high-temperature anneal may heat the Tier2 device 702, or at least a portion thereof, for a duration in a range from approximately one nanosecond to approximately one second.

Furthermore, in the illustrated embodiment, the method 600 includes a task 650 of forming vias 718 in the thermal shield stack 703 connecting the semiconductor devices 715 in the Tier2 device 702 to the semiconductor devices 711 in the Tier1 device 701. In one or more embodiments, the task 650 of forming the vias 718 in the thermal shield stack 703 includes etching the hBN layer 707. In one or more embodiments, the thickness of the thermal shield stack 703 (e.g., the thicknesses of the hBN layer 707 and the dielectric layers 708, 714) may be selected depending on the desired configuration of the vias 718. Additionally, unlike related art thermal shield stacks that include a copper (Cu) layer, which is difficult to etch to form vias, the thermal shield stack 703 according to the embodiment illustrated in FIG. 7F does not include a copper layer, which improves manufacturability of the vias 718 compared to the related art thermal shield stacks.

In one or more embodiments, the monolithic three-dimensional integrated circuit 700 including the Tier1 device 701, the Tier2 device 702 stacked on the Tier1 device 701, and the thermal shield stack 703 between the Tier1 device 701 and the Tier2 device 702 is complete following the task 645 of forming the semiconductor devices 715, vias 716, and metal interconnects 717 of the Tier2 device 702 and the task 650 of forming the vias 718 in the thermal shield stack 703.

The thermal shield stack 703 is configured to protect the semiconductor devices 711 and the metal interconnect layers 713 of the Tier1 device 701 during the task of performing a high-temperature anneal (e.g., annealing, such as by pulse heating, at a temperature of approximately 1,000° C. or greater) to improve dopant activation efficiency and reliability in the semiconductor devices 715 of the Tier2 device 702. The hBN layer 707 is configured to anisotropically dissipate heat generated during the task of performing the high-temperature anneal of the semiconductor devices 715 of the Tier2 device 702 (e.g., the hBN layer 707 exhibits anisotropic thermal conductivity). In one or more embodiments, the hBN layer 707 exhibits very high in-plane thermal conductivity (e.g., a k-value of approximately 400 W/m*K) and very poor out-of-plane thermal conductivity (e.g., a k-value of approximately 5 W/m*K). The very high in-plane thermal conductivity of the hBN layer 707 is configured to diffuse heat sideways (i.e., laterally) away from the Tier1 device 701 and the very poor out-of-plane thermal conductivity of the hBN layer 707 is configured to prevent or at least mitigate against the dissipation of heat downward toward the Tier1 device 701. Accordingly, the anisotropic thermal conductivity of the hBN layer 707 is configured to protect the Tier1 device 701 from the heat generated during the task of high-temperature annealing the semiconductor devices 715 of the Tier2 device 702, which might otherwise damage the metal interconnects 713 and/or the semiconductor devices 711 of the Tier1 device 701. In one or more embodiments in which the thermal annealing of the semiconductor devices 715 of the Tier2 device 702 is performed at a temperature of approximately 1,000° C. or greater, the hBN layer 707 of the thermal shield stack 703 is configured to prevent the Tier1 device 701 from being exposed to temperature in excess of approximately 400° C. (e.g., the hBN layer 707 of the thermal shield stack 703 is configured to maintain the Tier1 device 701 at a temperature of approximately 400° C. or less during the task of thermal annealing of the semiconductor devices 715 of the Tier2 device 702).

What is claimed is:

1. A method of manufacturing a monolithic three-dimensional integrated circuit comprising a first device, a second device on the first device, and a thermal shield stack between the first device and the second device, the method comprising:
    forming a Beryllium oxide layer on a silicon wafer of the first device;
    forming a carbon doped oxide layer on the Beryllium oxide layer, the Beryllium oxide layer and the carbon doped oxide layer defining the thermal shield stack;
    forming a plurality of semiconductor devices, vias, and metal interconnects on a silicon wafer to form the second device;
    bonding the first device to the second device; and
    forming vias in the thermal shield stack connecting the first device to the second device.

2. The method of claim 1, further comprising de-bonding the silicon wafer of the first device by activating a smart-cut in the silicon wafer of the first device.

3. The method of claim 1, forming a plurality of semiconductor devices, vias, and metal interconnects on the silicon wafer of the first device.

4. The method of claim 1, further comprising:
    forming a first dielectric layer on the carbon doped oxide layer; and
    forming a second dielectric layer on the second device, wherein the connecting the first device to the second device comprises bonding the first dielectric layer to the second dielectric layer.

5. The method of claim 4, wherein a dielectric material of the first dielectric layer and the second dielectric layer is selected from the group consisting of $SiO_2$, silicon carbon nitride (SiCN), and silicon nitride ($Si_3N_4$).

6. The method of claim 1, wherein the Beryllium oxide layer has a thickness in a range from approximately 5 nm to approximately 30 nm.

7. The method of claim 1, wherein the carbon doped oxide layer has a thickness in a range from approximately 30 nm to approximately 50 nm.

8. The method of claim 1, further comprising forming a second Beryllium oxide layer on the carbon doped oxide layer, and forming a second carbon doped oxide layer on the second Beryllium oxide layer.

9. A method of manufacturing a monolithic three-dimensional integrated circuit comprising a first device, a second device on the first device, and a thermal shield stack between the first device and the second device, the method comprising:
    forming a first dielectric layer on the first device;
    forming a carbon doped oxide layer on the first dielectric layer,
    forming a Beryllium oxide layer on the carbon doped oxide, the Beryllium oxide layer and the carbon doped oxide layer defining the thermal shield stack;
    forming a second dielectric layer on the Beryllium oxide layer;
    forming a third dielectric layer on a silicon wafer of the second device;
    bonding the first device to the second device by bonding the third dielectric layer to the second dielectric layer;
    forming a plurality of semiconductor devices, vias, and metal interconnects on the silicon wafer to form the second device; and
    forming vias in the thermal shield stack connecting the first device to the second device.

10. The method of claim 9, further comprising de-bonding the silicon wafer of the second device by activating a smart-cut in the silicon wafer of the second device.

11. The method of claim 9, wherein a dielectric material of the first dielectric layer, the second dielectric layer, and the third dielectric layer is selected from the group consisting of $SiO_2$, silicon carbon nitride (SiCN), and silicon nitride ($Si_3N_4$).

12. The method of claim 9, wherein the Beryllium oxide layer has a thickness in a range from approximately 5 nm to approximately 100 nm.

13. The method of claim 9, wherein the carbon doped oxide layer has a thickness in a range from approximately 10 nm to approximately 100 nm.

14. The method of claim 9, further comprising forming a second carbon doped oxide layer on the Beryllium oxide layer, and forming a second Beryllium oxide layer on the second carbon doped oxide layer.

15. A method of manufacturing a monolithic three-dimensional integrated circuit comprising a first device, a second device on the first device, and a thermal shield stack between the first device and the second device, the method comprising:
- epitaxially growing a hexagonal boron nitride layer on a surface of a silicon wafer;
- forming a first dielectric layer on the hexagonal boron nitride layer, the first dielectric layer and the hexagonal boron nitride layer defining the thermal shield stack;
- forming a second dielectric layer on the first device;
- bonding the first dielectric layer to the second dielectric layer;
- forming a plurality of semiconductor devices, vias, and metal interconnects on the silicon wafer to form the second device; and
- forming vias in the thermal shield stack connecting the first device to the second device.

16. The method of claim 15, wherein the epitaxially growing the hexagonal boron nitride layer comprises an electron-enhanced atomic layer deposition process.

17. The method of claim 15, wherein the hexagonal boron nitride layer has a thickness in a range from approximately 5 nm to approximately 100 nm.

18. The method of claim 15, further comprising de-bonding the silicon wafer of the first device by activating a smart-cut in the silicon wafer of the first device.

19. The method of claim 15, further comprising high-temperature annealing the semiconductor devices.

* * * * *